(12) United States Patent
Choi et al.

(10) Patent No.: US 8,564,181 B2
(45) Date of Patent: Oct. 22, 2013

(54) ELECTROACTIVE POLYMER ACTUATOR AND METHOD OF MANUFACTURING THE SAME

(75) Inventors: Seung-Tae Choi, Hwaseong-si (KR); Jong-Oh Kwon, Suwon-si (KR); Youn-Jung Park, Seoul (KR); Cheol-Min Park, Seoul (KR); Yeon-Sik Choi, Seoul (KR)

(73) Assignees: Samsung Electronics Co., Ltd., Suwon-Si (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/227,693

(22) Filed: Sep. 8, 2011

(65) Prior Publication Data

US 2012/0139393 A1 Jun. 7, 2012

(30) Foreign Application Priority Data

Dec. 7, 2010 (KR) ........................ 10-2010-0124438

(51) Int. Cl.
*H01L 41/18* (2006.01)
*H01L 41/047* (2006.01)

(52) U.S. Cl.
USPC .......................... 310/800; 310/340; 310/363

(58) Field of Classification Search
USPC ................. 310/328, 340, 363, 366, 800
See application file for complete search history.

(56) References Cited

U.S. PATENT DOCUMENTS

| | | | |
|---|---|---|---|
| 5,160,870 A * | 11/1992 | Carson et al. ................. | 310/339 |
| 5,488,954 A * | 2/1996 | Sleva et al. ................... | 600/459 |
| 5,568,679 A | 10/1996 | Ohya et al. | |
| 5,607,535 A | 3/1997 | Tsukada et al. | |
| 6,343,129 B1 | 1/2002 | Pelrine et al. | |
| 7,719,167 B2 | 5/2010 | Kwon et al. | |
| 7,891,077 B2 | 2/2011 | Lee et al. | |
| 2004/0139588 A1 | 7/2004 | Schreiner et al. | |
| 2004/0263028 A1 | 12/2004 | Pei et al. | |
| 2008/0284277 A1* | 11/2008 | Kwon et al. .................. | 310/309 |
| 2010/0237747 A1* | 9/2010 | Axelrod et al. ............... | 310/339 |
| 2010/0298720 A1* | 11/2010 | Potkay .......................... | 600/485 |
| 2011/0050041 A1* | 3/2011 | Yamamoto et al. ........... | 310/338 |
| 2011/0116171 A1* | 5/2011 | Kwon et al. .................. | 359/666 |

FOREIGN PATENT DOCUMENTS

| | | | |
|---|---|---|---|
| DE | WO2005086249 A1 * | 9/2005 | |
| JP | 4-12677 A | 1/1992 | |
| JP | 4-369277 A | 12/1992 | |
| JP | 6-84409 A | 3/1994 | |

(Continued)

OTHER PUBLICATIONS

Osada, Y., et al., (ed.), Polymer Sensors and Actuators, Springer, Berlin 2000. pp. 15-19, 90-91, 109-115, 149-151, 206-209, 325-327.

(Continued)

*Primary Examiner* — Thomas Dougherty
(74) *Attorney, Agent, or Firm* — Sughrue Mion, PLLC

(57) ABSTRACT

A multilayered electroactive polymer (EAP) device and a method of manufacturing the same is provided. The multilayered EAP device includes a plurality of unit layers. Each unit layer includes an EAP layer formed of an electroactive polymer (EAP), a protecting layer configured to prevent a material from penetrating into the EAP layer, and an active electrode formed using a conductive material. The protecting layer may be formed below the active layer or above the active layer. The active electrode may be interposed between two protecting layers.

25 Claims, 29 Drawing Sheets
(1 of 29 Drawing Sheet(s) Filed in Color)

(56) References Cited

FOREIGN PATENT DOCUMENTS

| | | |
|---|---|---|
| JP | 6-334236 A | 12/1994 |
| JP | 7-176802 A | 7/1995 |
| JP | 2009-267429 A | 11/2009 |
| KR | 10-1998-014734 A | 5/1998 |
| KR | 10-0862464 B1 | 10/2008 |
| KR | 10-2008-0100757 A | 11/2008 |
| KR | 10-2009-0011351 A | 2/2009 |
| WO | 2005/086249 A1 | 9/2005 |
| WO | WO2007029275 A1 * | 3/2007 |
| WO | WO2009059114 * | 5/2009 |
| WO | WO2012155276 A1 * | 11/2012 |

OTHER PUBLICATIONS

Xu, H.-S., et al., All-polymer electromechanical systems consisting of electrostrictive poly(vinylidene flouride-trifluoroethylene) and conductive polyaniline), Journal of Applied Polymer Science, 2000, vol. 75, pp. 945-951.

Ian W. Clelland et. al.: "Multilayer Polymer Film Capacitors Key Components in Differential EMI and RFI Bypass Applications Where Short Circuit and Heat Runaway Failures Cannot be Tolerated", APEC 2003 Exhibitor Seminar, Feb. 11, 2003; pp. 1-49.

* cited by examiner

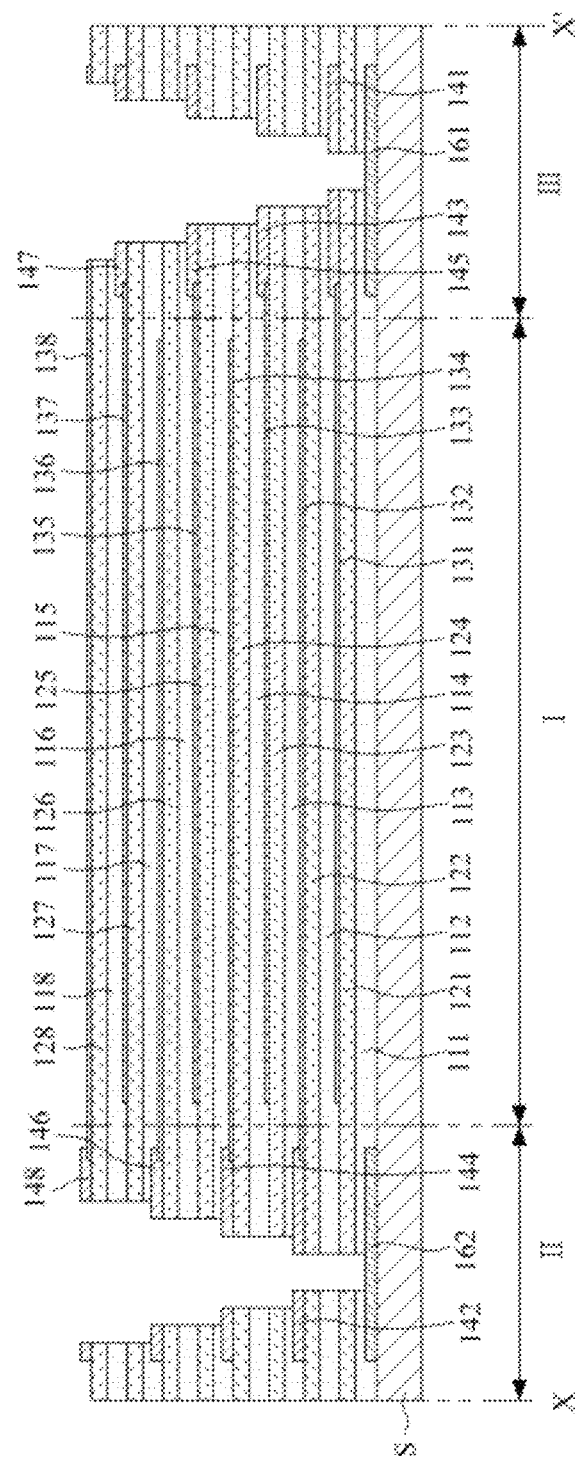

ELECTROACTIVE POLYMER ACTUATOR AND METHOD OF MANUFACTURING THE SAME

CROSS-REFERENCE TO RELATED APPLICATION

This application claims benefit under 35 U.S.C. §119(a) of Korean Patent Application No. 10-2010-0124438, filed on Dec. 7, 2010, the disclosure of which is incorporated by reference in its entirety for all purposes.

BACKGROUND

1. Field

The following description relates to an actuator, and more particularly, to an ElectroActive Polymer (EAP) actuator and a method of manufacturing the same.

2. Description of the Related Art

The term Electroactive Polymers (EAPs) generally refers to polymers whose shape is modified by electric stimulation. However, in a broad sense, EAP may refer to polymers whose shape is modified by chemical stimulation or thermal stimulation, in addition to electric stimulation. EAPs may be divided into types, such as Ionic Polymer Metal Composite (IPMC), dielectric elastomer, conducting polymer, polymer gel, Polyvinylidene Fluoride resins, carbon nanotubes, shape memory polymers, etc.

An EAP is widely used as a material for an actuator, which is a power transfer device to convert electric energy to mechanical energy. For example, an EAP actuator is used in various application devices, such as fluidic lenses, micro cameras, polymer Micro Electro Mechanical Systems (MEMS), bio systems, energy harvesting, etc. In addition, an EAP actuator is used in applications, such as sensors, capacitors, diaphragms, etc.

An EAP actuator deforms up to 5%, as compared with a ceramic piezoelectric actuator having a maximum strain of 0.2%. Accordingly, even a small sized EAP actuator can provide a relatively large displacement. In this regard, EAP actuators have gained a large amount of interest in various fields. For example, the field of varifocal fluidic lenses which are included in a high performance image pickup device in small sized and thin mobile electronic devices. Varifocal fluidic lenses are used to implement various functions, such as an Auto-Focus (AF) function, a zoom function, an Optical Image Stabilization (OIS) function, etc.

An EAP actuator deforms by a fraction of a percent at an electric field about 20 V/μm to 150 V/μm. Accordingly, in order to obtain a great displacement, for example, about 3% to 7%, in an EAP actuator using polymers having a thickness of about 10 μm, the driving voltage needs to be about 200V to 1500V. However, a conventional EAP actuator using such a high driving voltage has limited applications in certain devices, such as mobile electronic devices, which operate on a relatively low driving voltage of, for example 24V or less.

In order to reduce the driving voltage of an EAP actuator, the applicant of the present invention has filed "Electroactive Polymer Actuator and Method for Manufacturing the Same," Korea Patent Publication No. 2008-0100757, which discloses a multilayered EAP actuator.

The multilayered EAP polymer actuator has a structure in which a plurality of thin polymer layers are laminated on top of each other while alternately interposing driving electrodes that have different electric potentials therebetween. That is, the multilayered EAP actuator has a plurality of unit layers including a polymer layer formed of electroactive polymer and an active electrode formed on the polymer layer. However, if the active electrode is formed using a metal having a high rigidity, the flexural modulus of the multilayered EAP actuator, which has a plurality of active electrodes, is substantially increased and the displacement of the EAP actuator is reduced. In order to minimize the reduction in the displacement of an EAP actuator, the active electrode needs to be formed in a small thickness of several tens of nanometers. Alternatively, in order to minimize the reduction in the displacement of an EAP actuator, the active electrode may be formed using a conductive polymer instead of metal.

Of relevance to the present exemplary embodiments is that Korea Patent Publication No. 2008-0100757 discloses only the lamination of the respective layers therein. However, the present inventors have found that it is desirable to form a multilayer structure such as that disclosed in Korea Patent Publication No. 2008-0100757 using solution casting methods. The reason is that as opposed to film lamination, solution casting does not require transferring and aligning a thin film. Thus, solution casting simplifies manufacture and reduces manufacturing cost of the resulting multilayer structure. Further, solution casting produces a polymer thin film having a desired flat upper surface regardless of the profile of a base structure, and provides a superior adhesive force between layers, and produces a thin film having reduced contamination or defects. In addition, solution casting is desirable because it can be performed in a smaller space than lamination because it requires smaller process steps and equipment.

However, the present inventors found that if the multilayer EAP structure of Korea Patent Publication No. 2008-0100757 is produced by solution casting, the solution casting results in solvent from successive layers penetrating into already-deposited layers, and thus cracking the active electrode, damaging a surface of the EAP layer, or producing an uneven thickness in the thin film. The present inventors thus arrived at a solution as described herein which does not have the above undesirable features.

SUMMARY

In one aspect, there is provided a multilayered electroactive polymer device and a method of manufacturing the same, capable of reducing the manufacturing cost with a simpler manufacturing process, improving the productivity and improving the operation performance.

In another aspect, there is provided a multilayered electroactive polymer device and a method of manufacturing the same, capable of improving productivity while preventing an active electrode from being damaged.

In one general aspect, there is provided a multilayered electroactive polymer device including a plurality of unit layers that are stacked on top of each other. The unit layer includes an EAP layer formed of an electro-active polymer, a protecting layer configured to prevent a material from penetrating into the EAP layer, and an active electrode formed of a conductive material. The active electrode may be formed on the protecting layer. Alternatively, the active electrode may be formed on the EAP layer and the protecting layer may be formed on the EAP layer on which the active electrode is formed. The protecting layer may include a first protecting layer and a second protecting layer, and the active electrode may be interposed between the two protecting layers.

In another general aspect, there is provided a method of manufacturing a multilayered electroactive polymer device. The method is as follows. A first EAP layer is formed by forming an EAP solution on a substrate in a film shape and removing a solvent of the EAP solution. A protecting layer is formed to prevent a material from penetrating into the first EAP layer. An active electrode is formed of a conductive material. The protecting layer may be formed on the first EAP layer and the active electrode may be formed on the protecting layer. Alternatively, the active electrode may be formed on the first EAP layer and the protecting layer may be formed on the first EAP layer on which the active electrode is formed. Alternatively, the first protecting layer may be formed on the first EAP layer, the active electrode may be formed on the first protecting layer, and the second protecting layer may be formed on the first protecting layer on which the active electrode is formed. A second EAP layer may be formed by forming the EAP solution on the protecting layer in a film shape and removing a solvent of the EAP solution.

In another general aspect, there is provided a multilayered electroactive polymer device, which includes a plurality of pairs of unit layers that are stacked on top of each other and is divided into an actuating area and a first non-actuating area and a second non-actuating area that are adjacent to either side of the actuating area. Each of the pairs of unit layers includes a first EAP layer formed of an EAP, a first protecting layer configured to prevent a material from penetrating into the first EAP layer, a first active electrode which is formed of a conductive material and extends from the actuating area to the first non-actuating area, a second EAP layer formed on the first EAP layer by use of the EAP, a second protecting layer configured to prevent a material from penetrating into the second EAP layer, and a second active electrode which is formed of a conductive material and extends from the actuating area to the second non-actuating area. The protecting layer may be formed on at least one of a lower part and an upper part of the active electrode.

In another general aspect, there is provided a method of manufacturing a multilayered electroactive polymer device. The method is achieved by repeating a sequence including following operations. A first EAP layer is made by forming an EAP solution on a substrate, which is divided into a first non-actuating area and a second non-actuating area adjacent to an actuating area, in a film shape and removing a solvent of the EAP solution. A protecting layer is formed on the first EAP layer. A first active electrode is formed to cover at least the actuating area and extend to the first non-actuating area. A second EAP layer is formed by forming the EAP solution on the protecting layer, on which the first active electrode is formed, in a film shape and removing a solvent of the EAP solution. A second protecting layer is formed on the second EAP layer. A second active electrode is formed to cover at least the actuating area and extend to the second non-actuating area. The order of forming the protecting layer and the active electrode may be exchanged. Alternatively, the method may further include forming a protecting layer after the active electrode has been formed.

Other features will become apparent to those skilled in the art from the following detailed description, which, taken in conjunction with the attached drawings, discloses exemplary embodiments.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 10A to 10J are cross sectional views showing a method of manufacturing the multilayered EAP device of FIG. 5.

Elements, features, and structures are denoted by the same reference numerals throughout the drawings and the detailed description, and the size and proportions of some elements may be exaggerated in the drawings for clarity and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and structures are omitted to enhance clarity and conciseness. In the description of the exemplary embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present.

Electroactive polymer devices may be applied in various types of electronic devices capable of using a generative force in conjunction with a deformation by electrical stimulation. For example, an EAP device may include an actuator or a diaphragm configured to convert electric energy into mechanical energy, a sensor to convert mechanical energy into electric energy, or a capacitor to store electric charges.

A multilayered EAP device described below refers to an EAP device having a predetermined structure in which a plurality of thin EAP layers are stacked on top of each other and active electrodes having opposite polarities are alternately interposed between the EAP layers. That is, the multilayered EAP device has a structure in which a plurality of unit layers, each having an EAP layer and an active electrode formed on a surface of the EAP layer, are stacked on top of each other. In general, the stacking of the unit layers makes it possible to reduce the driving voltage of an actuator or a diaphragm, amplify a current generated in a sensor, or magnify the capacitance of a capacitor. However, the utility of the stacking of the unit layer is not limited thereto.

Figure 1:
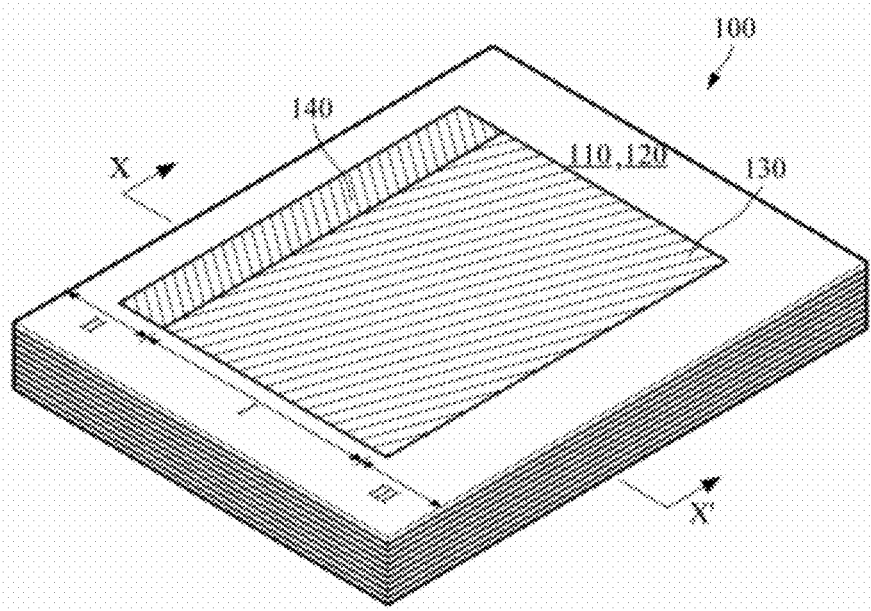
FIG. 1 is a perspective view showing an example of a schematic configuration of a multilayered electroactive polymer device.
Figure 2A:
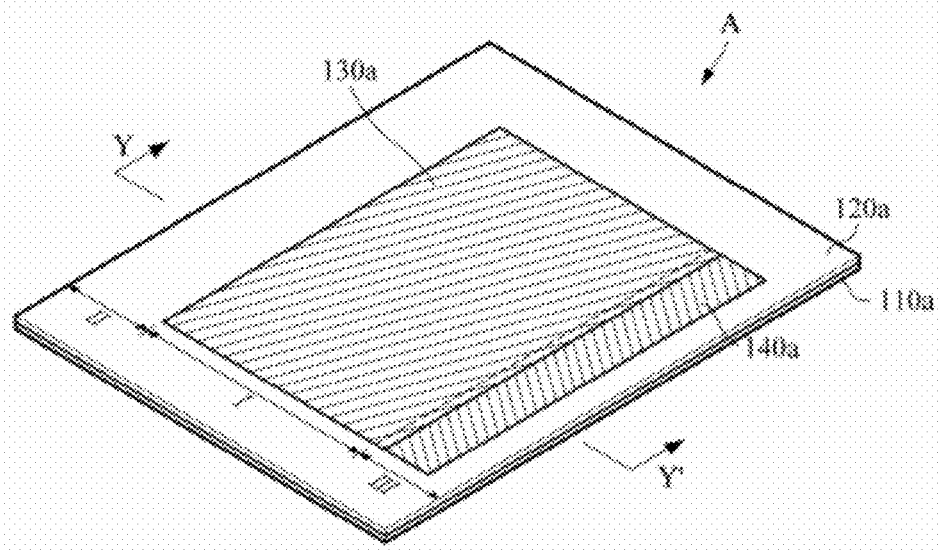
FIGS. 2A and 2B are perspective views each showing unit layers forming the multilayered EAP device of FIG. 1.
Figure 2B:
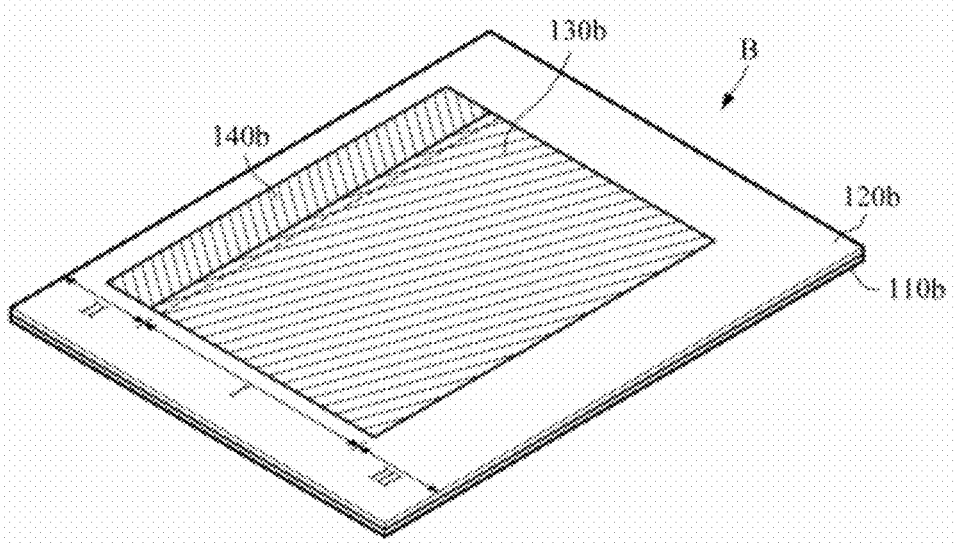

FIG. 1 is a perspective view showing an example of a schematic configuration of a multilayered electroactive polymer device. FIGS. 2A and 2B are perspective views each showing unit layers forming the multilayered EAP device of FIG. 1. As shown in FIGS. 1, 2A, and 2B, the electroactive polymer device 100 includes a protecting layer, i.e., a protective layer, 120, designating protecting layers depicted by reference numerals 120a and 120b, and an EAP layer 110, designating EAP layers depicted by reference numerals 110a and 110b. For the sake of convenience, FIGS. 1, 2A, and 2B do not show components configured to connect extension electrodes 140, designating extension electrodes depicted by reference numerals 140a and 140b, and electric circuits for driving the multilayered EAP device 100 and other peripheral structures, such as a fixing frame. The components may include via holes (H1 and H2 in FIG. 6) and common electrodes (151 and 152 in FIG. 6) formed in non-actuating areas (II and III).

The multilayered EAP device 100 has the planar shape of a square, but the shape of the multilayered EAP device 100 is not limited thereto. According to another example, the multilayered EAP device 100 may have various kinds of planar shapes depending on the type of applications of the multilayered EAP device 100. For example, the multilayered EAP device 100 may have the polygonal planar shape illustrated in FIGS. 9A and 9B.

As shown in FIGS. 1, 2A, and 2B, the multilayered EAP device 100 is divided into an actuating area (I) and non-actuating areas (II and III). Such a division of the multilayered EAP device 100 is determined based on not only physical structure but also functional characteristics. For example, the actuating area (I) may refer to an area providing displacement with the application of a driving voltage in a multilayered EAP actuator, an area generating a current when deformation occurs in a multilayered EAP sensor, and an area storing electric charges in a multilayered capacitor. Accordingly, the planar shape of the actuating area (I) may correspond to the shape of a plane which is interposed between two active electrodes having opposite polarities. The planar shape of the actuating area (I) may be implemented in various forms. For example, the planar shape of the actuating area (I) may be provided in a trapezoid having at least two sides parallel to each other, or may be provided in a circle.

In a broad sense, the non-actuating areas (II and III) refer to portion of the multilayered EAP device 100 not including the actuating area (I). In a narrow sense, non-actuating areas (II) and (III) may refer to a portion that is used for an electrical connection of active electrodes that are stacked on top of each other. The non-actuating areas (II and III) may include at least two portions adjacent to the actuating area (I). That is, a first non-actuating area (II) and a second non-actuating area (III). In this case, the non-actuating areas (II and III) may be used to electrically connect the stacked active electrodes 130, designating active electrodes depicted by reference numerals 130a and 130b. Alternatively, the non-actuating areas (II and III) may be used to physically fix the multilayered EAP device 100 to another component. For example, to a fixing frame.

The multilayered EAP device 100 has a structure including a plurality of pairs of unit layers that are stacked on top of each other, in detail, including two types of unit layers alternately stacked on top of each other. For example, when the multilayered EAP actuator 100 shown in FIG. 6 includes eight unit layers, odd numbered layers, including a first layer, a third layer, a fifth layer and a seventh layer (hereinafter, denoted as 'A' and referred to as a first unit layer) may have a structure shown in FIG. 2A, and even numbered layers, including a second layer, a fourth layer, a sixth layer and an eighth layer (hereinafter, denoted as 'B' and referred to as a second unit layer). Alternatively, the odd numbered layers may have a structure of the second unit layer 'B' and the even numbered layers may have a structure of the first unit layer 'A'.

As shown in FIGS. 2A and 2B, each of the first unit layer (A) and the second unit layer (B) includes EAP layers 110a and 110b, protecting layers 120a and 120b, active electrodes 130a and 130b, and extension electrodes 140a and 140b. Each of the first unit layer (A) and the second unit layer (B) is divided into an actuating area (I) and non-actuating areas (II and III). Regardless of the type of unit layer between the first unit layer (A) and the second unit layer (B), the actuating area (I) includes the EAP layers 110a and 110b, the protecting layers 120a and 120b, and the active electrodes 130a and 130b. Each of the non-actuating areas (II and III) include the EAP layers 110a and 110b, the protecting layers 120a and 120b, the active electrodes 130a and 130b, and the extension electrodes 140a and 140b.

The first unit layer (A) is different from the second unit layer (B) in the disposition of the extension electrodes 140a and 140b. For example, the extension electrode 140a of the first unit layer (A) and the extension electrode 140b of the second unit layer (B) are disposed opposite to each other with respect to the active electrodes 130a and 130b. However, the disposition of the extension electrodes 140a and 140b is not limited thereto as long as the position of the extension electrode 140a and the extension electrode 140b is different from the first unit layer (A) to the second unit layer (B). As described above, by changing the position of the extension electrodes 140a and 140b from the first unit layer (A) to the second unit layer (B), active electrodes of the first unit layers (A) are grouped into one group and active electrodes of the second unit layers (B) are grouped into another group such that different electric potentials are applied to different groups. Accordingly, the multilayered EAP device 100 shown in FIG. 1 has a configuration in which an active electrode connected to a positive electric potential, for example, the active electrode 130a, and an active electrode connected to a negative electric potential, for example, the active electrode 130b, are alternately disposed with respect to the active area (I). Alternatively, the active electrode 130a connected to a positive electric potential and the active electrode 130b connected to a negative electric potential are disposed at different layers corresponding to one side of the active area (I).

Figure 3A:
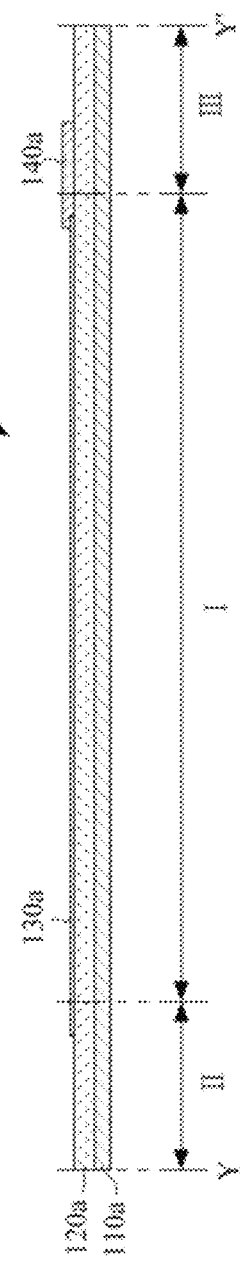
FIG. 3A is a cross sectional view taken along line Y-Y' of FIG. 2A.

FIG. 3A is a cross sectional view taken along line Y-Y' of FIG. 2A. Hereinafter, the following description will be made in relation to the stacked structure of the first unit layer (A) of FIG. 2A. It would be obvious to one of ordinary skill in the art that the description can be applied to that of the second unit layer (B) of FIG. 2B.

As shown in FIG. 3A, the protecting layer 120a is formed on the EAP layer 110a, and the active electrode 130a is formed on the upper surface of the protecting layer 120a in the actuating area (I). The active electrode 130a may have a size covering at least the entire actuating area (I) and extending to the non-actuating area (III). A portion of the active electrode 130a extending to the non-actuating area (III) is configured to connect to the extension electrode 140a, and the size and the shape of the portion are not limited. The extension electrode 140a connected to the active electrode 130a is used to electrically connect the active electrodes 130a that are stacked on top of each other. The electric connection of the extension electrode 140a will be described below.

Figure 3B:
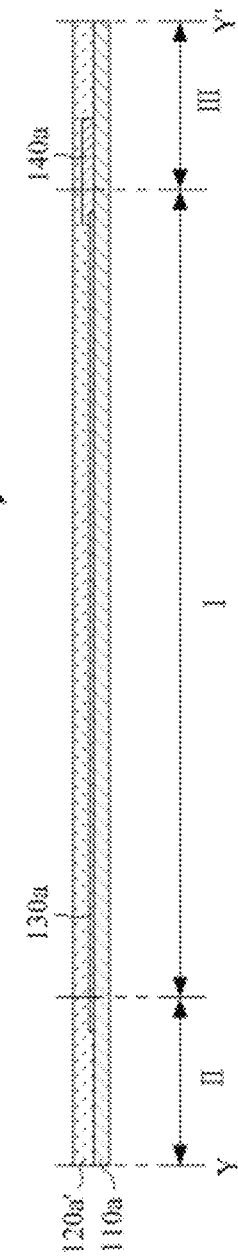
FIGS. 3B and 3C are cross sectional views each showing alternative embodiments of FIG. 3A.
Figure 3C:
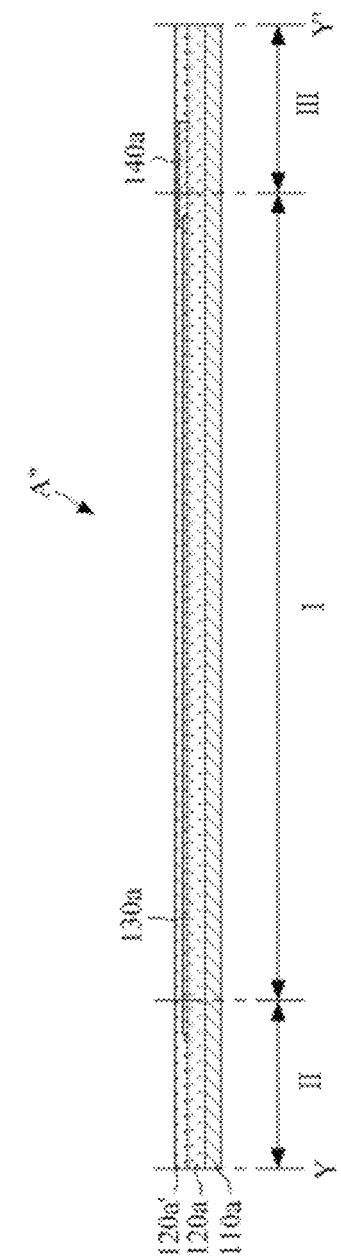

The stacked structure of the unit layers (A and B) is not limited thereto, and may be implemented in various forms of stacked structures. FIGS. 3A and 3B each show different stacked structures of the unit layer. As shown in FIG. 3A, for a unit layer (A'), the active electrode 130a and the extension electrode 140a are formed on the EAP layer 110a, and the protecting layer 120a' is formed on the EAP layer 110, on which the active electrode 130a and the extension electrode 140a are formed. That is, the unit layer (A) shown in FIG. 3A has a structure stacked in the order of the EAP layer 110a, the protecting layer 120a, and the electrode layers 130a and 140a. Different from the unit layer (A), the unit layer (A') has a structure stacked in the order of the EAP layer 110a, the electrode layers 130a and 140a, and the protecting layer 120'. A unit layer (A") shown in FIG. 3C is different from the unit layers (A and A') of FIGS. 3A and 3B in that a second protecting layer 120a' is additionally formed on the stacked structure shown in FIG. 3A including the EAP layer 110a, the protecting layer 120a, and the electrode layers 130a and 140a. That is, the electrode layers 130a and 140a are formed between the first protecting layer 120a and the second protecting layer 120a'.

As described above, the unit layer forming the multilayered EAP device further includes a protecting layer regardless of the type of the unit layer between the first unit layer (A) and the second unit layer (B). The protecting layer may be formed under the active electrode and the extension electrode (see FIG. 3A), on the active electrode and the extension electrode (see FIG. 3B) or under and on the active electrode and the extension electrode (see FIG. 3C). Hereinafter, the description of a stacked structure will be made in relation to a unit layer where the electrode layers 130 and 140 are formed on the protecting layer 120, and a description for another stacked structure will be made only in relation to the difference from this example.

Referring to again FIGS. 1, 2A, and 2B, the EAP layer may be formed using, i.e., formed of, a dielectric polymer that is deformable by electric stimulation. For example, the EAP layer 110, designating EAP layers depicted by reference numerals 110a and 110b, may be formed using a dielectric elastomer, such as a silicone based dielectric elastomer or a polyurethane based dielectric elastomer, a ferro-electric polymer, such as PVDF(polyvinylidene fluoride) and P(VDF-TrFE)(poly(vinylidene fluoride)—trifluroethylene), and a relaxor ferro-electric polymer, such as P(VDF-TrFE-CFE)(poly(vinylidene fluoride-trifluoroethylene-chlorofluoroethylene)). In addition, P(VDF-TrFE-CTFE)(poly(vinylidene fluoride-frifluoroethylene-chlorotrifluoroethylene) may be used. The EAP layer 110 formed using such a dielectric polymer may have a thickness of 1 μm or less.

The protecting layer 120, designating protecting layers depicted by reference numerals 120a and 120b, serves to prevent an electrode, for example, the active electrode 130 that is formed under the EAP layer 110, from being damaged when the EAP layer 110 is formed through a solution casting in the method of manufacturing the multilayered EAP device 100. Solution casting represents a procedure of creating material layers by dispensing a solution, in which a substance such as electroactive polymers is dissolved, on a substrate to form a desired form of a film, and removing a solvent from the solution. Representative examples of solution casting are spin coating, dip coating, and spray coating.

When forming a polymer thin film such as the EAP layer 110, solution casting has the following advantage, as compared to a film lamination method, which is a procedure of creating material layers by transferring a prefabricated polymer thin film to an alignment position and adhering it through thermocompression. Different from the film lamination method, the solution casting method does not require transferring and aligning a thin film. The solution casting method thereby simplifies the manufacturing method, and thus reduces the manufacturing cost. In addition, the solution casting method may be performed in a smaller space than, for example, lamination, because it requires smaller process steps and equipment. The solution casting method produces a polymer thin film having a desired flat upper surface regardless of the profile of a base structure, and provides a superior adhesive force between layers. In addition, the solution casting method produces a thin film having less contamination or defects even though the thickness of the thin film is reduced to a desired level.

However, in general, solution casting has limited applications in a process of forming an EAP layer in a multilayered EAP device including a plurality of polymer thin films stacked on top of each other. This is because if an EAP layer of a typical multilayered EAP device is formed using solution casting, the solution casting results in an active electrode being cracked, a surface of the EAP layer being damaged, or uneven thickness of a thin film being achieved.

In more detail, the active electrode included in the multilayered EAP device is formed using a metal or a conducive polymer having a thickness of about 50 nm or less to minimize the reduction of the displacement of the multilayered EAP device due to the thickness of the active electrode. When a conventional multilayered EAP device having a plurality of unit layers, each including an EAP layer, an active electrode, and an extension electrode without a protecting layer, is manufactured using the solution casting, a solvent of the solution applied to form an upper EAP layer may penetrate into a lower EAP layer. This is because the upper EAP layer and the lower EAP layer are formed using the same polymer material, and the solvent of the solution applied to form the upper EAP layer may similarly dissolve the lower EAP layer. If the solvent of the upper EAP layer penetrates into the lower EAP layer and dissolves the lower EAP layer, swelling occurs in the lower EAP layer 110, and thus the EAP layer 110 is deformed. As a result, a buckling occurs in the active electrode 130 that is formed on the surface of the EAP layer 110, and results in wrinkling of the active electrode 130. In a more severe case, the active electrode 130 may be cracked. The wrinkling of the active electrode 120 causes a change in electric field when driving the multilayered EAP device 100 and degrades the performance of the multilayered EAP device 100. Alternatively, the multilayered EAP device 100 may have an electrical breakdown and the performance of the multilayered EAP device 100 may be degraded.

Figure 11:
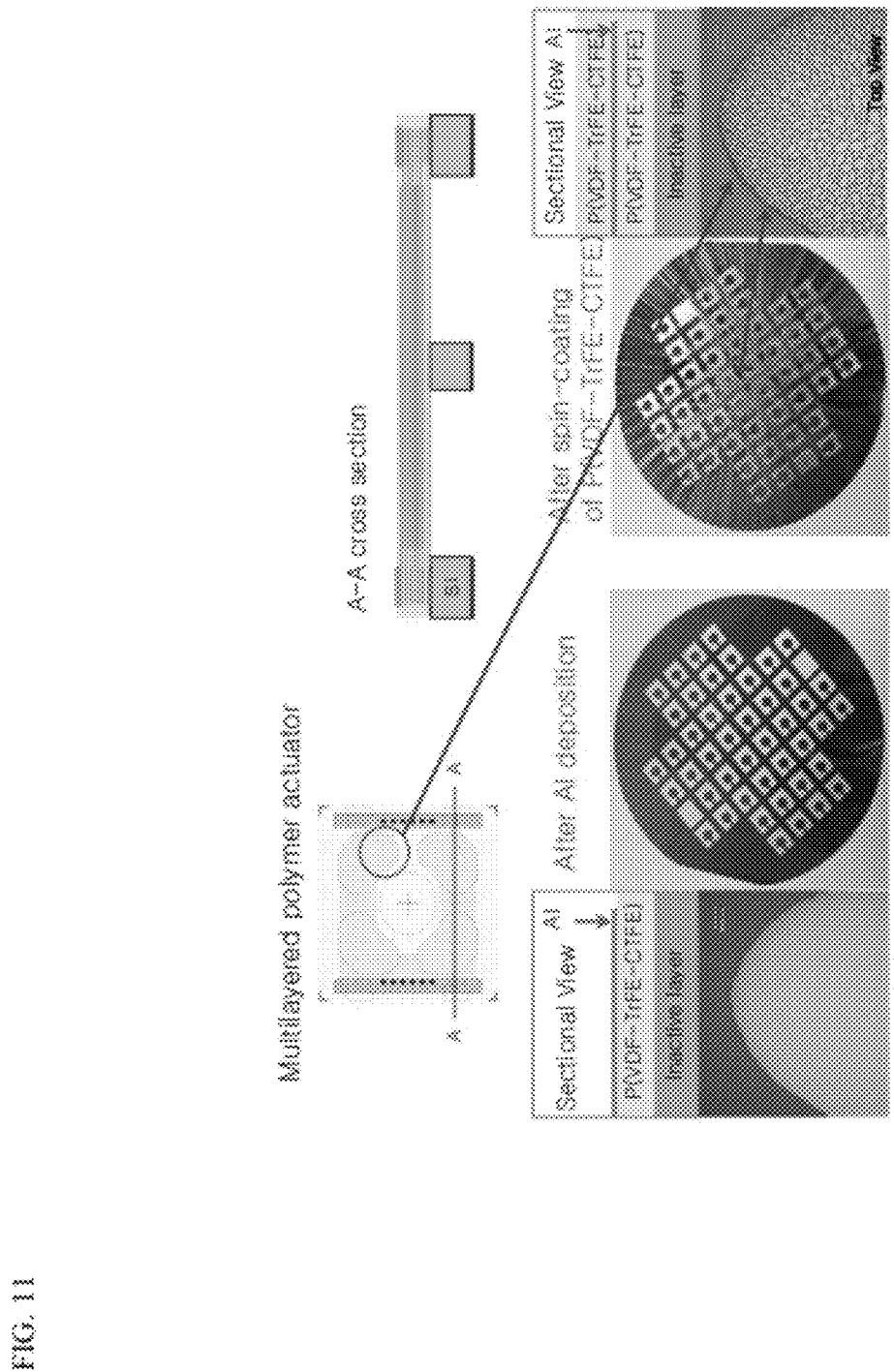
FIG. 11 is a figure showing the damage that is done to underlying layers in a multilayered EAP device in the absence of a protecting layer.

The damage described above may be more understood by reference to FIG. 11, which shows the damage that may be observed when a multilayered EAP is formed using solution casting in the absence of a protecting layer. In particular, the diagram and picture on the left side of FIG. 11 show a first unit layer of a multilayered EAP device after being formed by solution casting (titled "After Al deposition"). As can be seen, the first unit layer is not damaged by solution casting. However, when a second unit layer is coated onto the first unit layer by solution casting, the damage that may occur is shown in the figure and picture on the right side of FIG. 11 (entitled "After spin-coating of P(VDF-TrFE-CTFE)"). As can be seen in the picture of the wafer, the underlying unit layer has been visibly damaged by the penetration of the solvent from the second unit layer into the first unit layer. The damage is also evident when comparing the SEM photographs of a representative electrode on the wafer in FIG. 11. The SEM photograph on the right shows the damage to the electrode (when compared to the undamaged electrode shown on the left of FIG. 11) that occurred upon the solution casting of the additional unit layer.

Different from the general multilayered EAP device manufacturing method, according to an exemplary embodiment, the protecting layer 120a is formed on the upper surface of the EAP layer 110a of the multilayered EAP device having the unit layer (A or A") shown in FIG. 3A or FIG. 3C, respectively. The protecting layer 120a prevents a solvent from an EAP solution, which is used when another EAP layer 110a is formed on the EAP layer 110a through a solution casting method, from penetrating into the EAP layer 110a positioned under the newly formed EAP layer 110a. Similarly, the protecting layer 120a' is formed on the upper surface of the EAP layer 110a of the multilayered EAP device, which has the unit layers (A' or A") shown in FIG. 3A or 3C, respectively, and on which the active electrode 130a and the extension electrode 140a are formed. The protecting layer 120a prevents a solvent from an EAP solution, which is used when another EAP layer 110a is formed on the EAP layer 110a through a solution casting method, from penetrating into the EAP layer 110a adjacent to the newly formed EAP layer 110a. As described above, the protecting layer 120a' prevents a material from penetrating into the EAP layer 110a, thereby preventing the wrinkling of the active electrode 130a due to the swelling of the EAP layer 110a. As a result, the electric field applied to drive the multilayered EAP device 100 is kept constant.

For a unit layer including only one protecting layer, such as the unit layers (A and A') including the protecting layers 120a and 120a', respectively, shown in FIGS. 3A and FIG. 3B, the protecting layers 120a and 120a' have a predetermined thickness or above, for example, 5000 Å or above, enough to prevent the penetration of solution. However, the thickness of the protecting layers 120a and 120a' needs to be thin enough to guarantee a desirable amount of displacement of a multilayered EAP actuator.

Since the protecting layers 120a and 120a' of the unit layer (A)' shown in FIG. 3C are disposed at lower positions and upper positions of the electrodes 130a and 140a, even if the total thickness of the protecting layers 120a and 120a' of FIG. 3C is smaller than the protecting layer of the unit layers (A and A') of FIGS. 3A and 3B, this results in higher efficiency in preventing the penetration of solvent as compared to the protecting layers of FIGS. 3A and 3B. That is, the first protecting layer 120a, the electrodes 130a and 140a, and the second protecting layer 120a' stacked on top of each other forms an integral body and produces a superior efficiency in preventing the penetration of solvent. For example, the total thickness of the protecting layers 120a and 120a' is about 2000 Å to 3000 Å.

For the unit layer (A") shown in FIG. 3C, the first protecting layer 120a protects the lower EAP layer from the penetration of solvent, and the second protecting layer 120a' enhances the function of the first protecting layer 120a while protecting the electrodes 130a and 140a from the penetration of solvent. Accordingly, it is preferable that the first protecting layer 120a has a thickness larger than that of the second protecting layer 120a'. For example, the first protecting layer 120a may have a thickness of about 1500 Å to 2500 Å and the second protecting layer 120a' may have a thickness of about 500 Å to 1000 Å.

Referring again to FIGS. 1, 2A, and 2B, in order to prevent the active electrode 130 from being damaged when the EAP layer is formed by a solution casting method, the protecting layer 120 may be formed using a material which is not resoluble to a solvent to which the EAP is resoluble. Accordingly, the type of material differ with the type of solvent forming the EAP solution. In order to form the protecting layer 120 using solution casting, the protecting layer 120 is formed using a polymer material which is resoluble to a solvent to which the EAP is not resoluble.

Figure 4A:
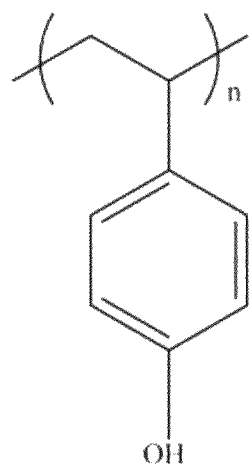
FIG. 4A to 4F are views showing molecular formulae of materials that are used for a protecting layer.
Figure 4B:
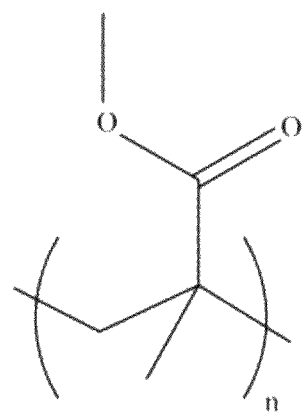
Figure 4C:
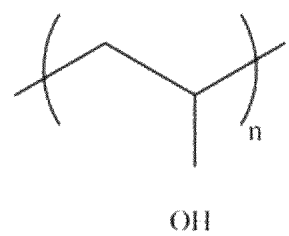
Figure 4D:
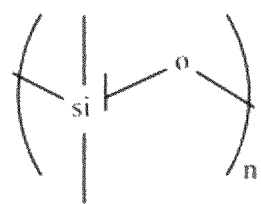
Figure 4E:
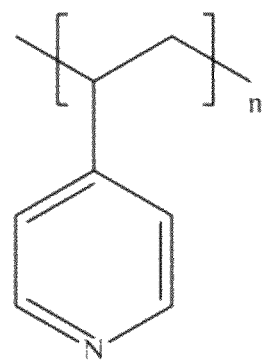
Figure 4F:
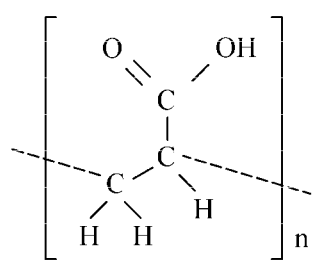

For example, the EAP layer 110 may be formed thorough a solution casting method using a solution including P(VDF-TrFE-CFTE) polymer which is dissolved in a ketone based solvent. Since the P(VDF-TrFE-CFTE) polymer is not resoluble in water or alcohol, the protecting layer 120 may be formed using a polymer material which is resoluble in water or alcohol and not resoluble in a ketone based solvent. For example, the protecting layer 120 may include at least one selected from the group consisting of polyvinylphenol (PVP, see FIG. 4A), polymethylmethacrylate (PMMA, see FIG. 4B), polyvinylalcohol (PVA, see FIG. 4C), polydimethylsiloxane (PDMS, see FIG. 4D), poly(4-vinylpyridine)(P4VP, see FIG. 4E) and polyacrylic acid (PAA, see FIG. 4F), and combinations thereof. More particularly, the protecting layer 120 may include at least one selected from the group consisting of PVP and PAA.

The active electrode 130 has different functions depending on the type of multilayered EAP device 100. For example, if the multilayered EAP device 100 is an electronic device, such as an actuator or a diaphragm, to convert an electric energy to a mechanical energy, the active electrode 130 serves to induce an electric field which results in the deformation of the EAP layer 110. If the multilayered EAP device 100 is an electronic device, such as a sensor, to convert mechanical energy to electronic energy, the active electrode 130 may accommodate electric carriers generated due to the deformation of the EAP layer 110.

The active electrode 130 may be formed using a conductive material. For example, the active electrode 130 may include at least one material selected from the group consisting of gold (Au), copper (Cu), silver (Ag), aluminum (Al), nickel (Ni), chrome (Cr), iron (Fe), an alloy thereof, or combinations thereof. Alternatively, the active electrode 130 may include at least one selected from the group consisting of polyaniline, polypyrrole, PEDOT[Poly(3,4-ethylenedioxythiophene)]:PSS[poly(4-styrenesulfonic acid)], and combinations thereof.

The active electrode 130 formed using metal has a thin thickness not influencing the performance of the multilayered EAP device 100. For example, when the active electrode 130 is formed using metal having a high electrical conductivity, the active electrode 120 is provided in a thickness of about 50 nm or below. In particular, the multilayered EAP device 100 includes the protecting layer 120 having a non-electroactuating characteristic, so that the actuating electrode 130 needs to be provided in a thickness as thin as possible.

The extension electrode 140 disposed on the non-actuating areas (II and III) is electrically connected to the active electrode 130 that extends from the actuating area (I) to the non-actuating areas (II and III). The non-actuating areas (II and III) may be areas adjacent to the actuating area (I), and their position, size and shape is not limited. A driving voltage is applied to the active electrode 130 through the extension electrode 140, or a current collected in the active electrode 130 may flow to an external circuit through the extension electrode 140.

The extension electrode 140 may be provided in a shape and/or thickness capable of minimizing the electrical resistance. For example, the extension electrode 140 may be provided in the form of a bar in the non-actuating areas (II and III), but the shape of the extension electrode 140 is not limited thereto. The extension electrode 140 may be provided in a thickness larger than that of the active electrode 130, for example, a thickness of about 50 nm or above. The metal material forming the extension electrode 140 may include a material including at least one selected from the group consisting of gold (Au), copper (Cu), silver (Ag), aluminum (Al), nickel (Ni), chrome (Cr), iron (Fe), an alloy thereof, and combinations thereof, except for a metal material highly reactive with respect to laser, for example, an aluminum-copper (Al—Cu) alloy and an aluminum-titanium alloy.

As described above, the active electrode 130 of the multilayered EAP device 100 may be formed using a metal provided in a thin thickness of about 50 nm. However, even for a thin metal, the metal has a relatively high modulus of elasticity and the unit layer has a structure including a plurality of layers stacked on top of each other, increasing the flexural modulus of the multilayered EAP device 100. In addition, the protecting layer 120 does not show substantial deformation under an electric field, so the multilayered EAP device 100 including the protecting layer 120 may have a lower performance than a multilayered EAP device without having a protecting layer.

Figure 5:
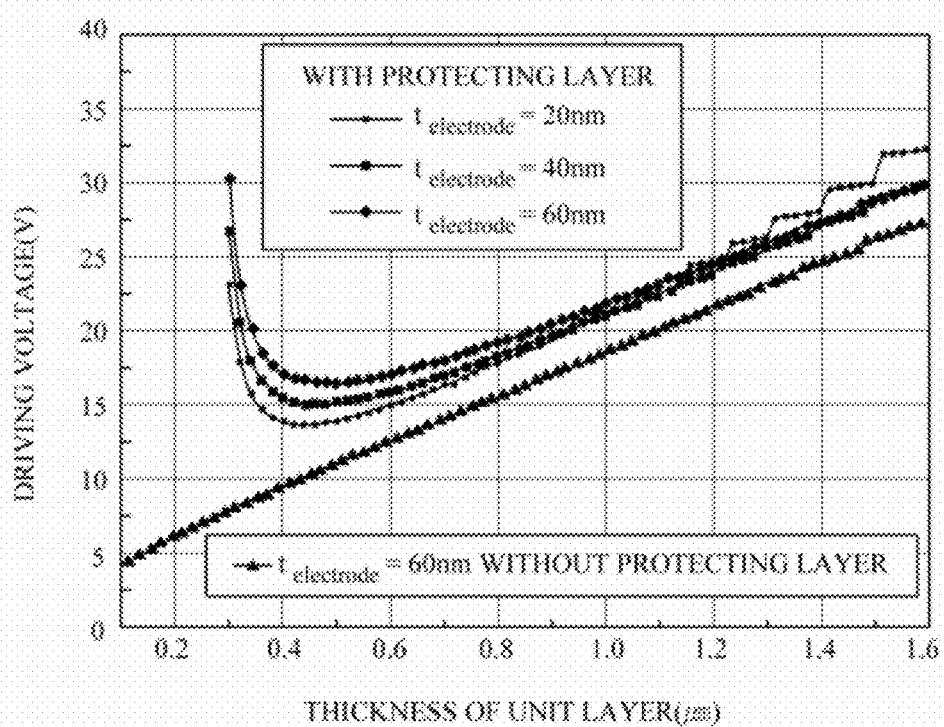
FIG. 5 is a graph showing a driving voltage of the multi-layered EAP actuator with the change of the unit layer in a thickness.

FIG. 5 is a graph showing the driving voltage of a multilayered EAP actuator against the change of the unit layer in a thickness. The graph shows driving voltages of a multilayered EAP actuator (formed by lamination) without a protecting layer (the line represented by triangles) and multiple multilayered EAP actuators that include a protecting layer. As previously discussed, the multilayered EAP actuators having a protecting layer include an active electrode formed using aluminum and a protecting layer formed using PAA. With respect to the data reflected in FIG. 5, the protecting layer has a fixed thickness of 280 nm regardless of the thickness of the unit layer. FIG. 5 shows how the driving voltage changes as the unit layer thickness changes and shows that even though the presence of a thickness layer increases the driving voltage of a unit layer, it does so only insignificantly. In particular, FIG. 5 shows that in all thicknesses of the active electrode, multilayered EAP actuators having a protecting layer have driving voltages insignificantly higher than that of the laminated multilayered EAP actuator not including a protecting layer (represented by triangles). Thus, FIG. 5 shows that the presence of the protecting layer only insignificantly raises the resulting driving voltages and thus the degradation of the performance of the multilayered EAP actuator with a protecting layer (versus the EAP actuator without the protecting layer) is negligible. For example, FIG. 5 shows that if a unit layer is provided in a thickness of 1 μm, the multilayered EAP actuator not having a protecting layer has a driving voltage of about 21V to 22V, which is only about 2 or 3 V lower than of the driving voltage of the multilayered EAP actuator having a protecting layer (24V).

Figure 6:
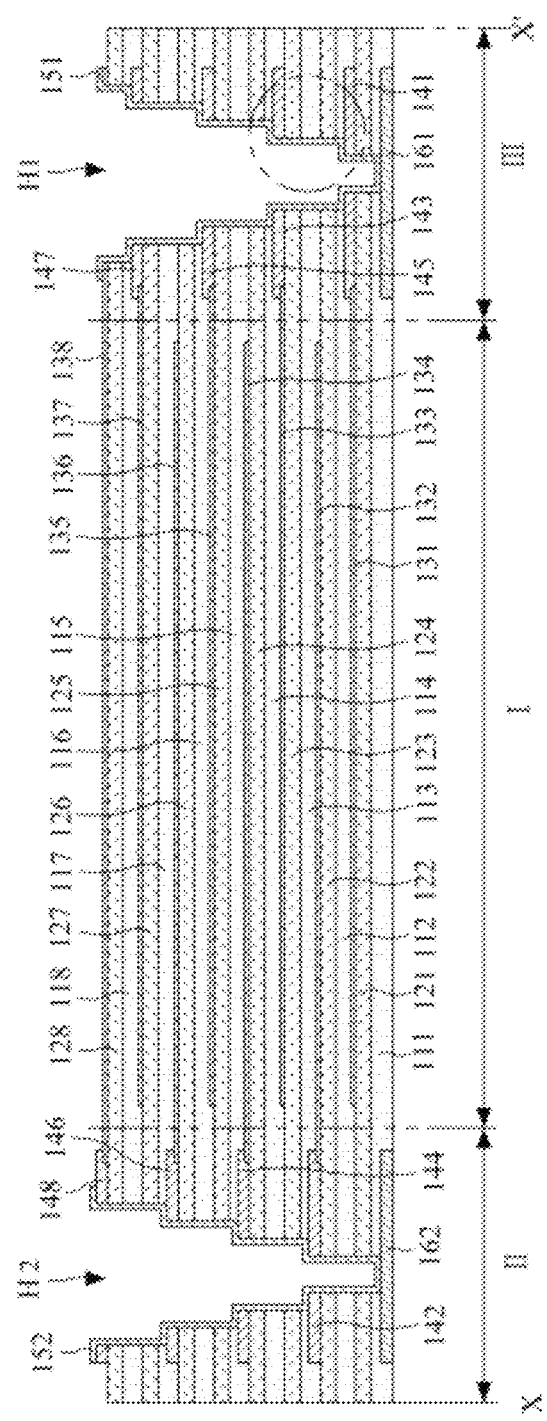
FIG. 6 is a cross sectional view taken along line X-X' of FIG. 1.

FIG. 6 is a cross sectional view taken along line X-X' of FIG. 1. As shown in FIG. 6, the multilayered EAP device 100 includes eight unit layers including four first unit layers (A) and four second unit layers (B), but exemplary embodiments may be provided with a different number of unit layers. Absent from FIGS. 1, 2A, and 2B, FIG. 6 shows common electrodes 141 and 142 that are used to electrically connect the stacked active electrodes 111 to 118 in groups. Hereinafter, the following description will be made in relation to a multilayered EAP actuator as an example of the multilayered EAP device 100, but may be applied to other types of multilayered EAP devices.

As shown in FIG. 6, the multilayered EAP actuator includes a plurality of eight unit layers, each divided into an actuating area (I) and non-actuating areas (II and III). The unit layers include the EAP layers 111 to 118, the protecting layers 121 to 128, the active electrodes 131 to 138, and the extension electrodes 141 to 148. The protecting layers 121 to 128 are formed on the EAP layers 111 to 118, respectively. The active electrodes 131 to 138 are each formed on one surface of the protecting layers 121 and 128 and extend to the non-actuating areas (II and III) while covering at least the actuating area (I). The extension electrodes 141 to 148 are formed on the non-actuating areas (II and III) and are electrically connected to the active electrodes 131 to 138 extending to the non-actuating areas (II and III).

As described above, the protecting layers 121 to 128 and the electrodes 131 to 138 and 141 to 148 may exchange positions. In more detail, the active electrode and the extension electrode are formed on each of the EAP layers 111 to 118 and the protecting layer is formed on each of the EAP layers 111 to 118 on which the active electrode and the extension electrode are formed. Alternatively, another protecting layer may be formed on each of the protecting layers 121 to 128 on which the active electrodes 131 to 138 and the extension electrodes 141 to 148 are formed (see FIG. 3C).

In order for a positive driving voltage and a negative driving voltage to be alternately applied to the active electrodes 131 to 138, the active electrodes 131 to 138 are divided into two groups of active electrodes, with a first group of active electrodes connected to a positive electric potential and a second group of active electrodes connected to a negative electric potential. To this end, the active electrodes included in the same group are electrically connected to each other through an interconnection electrode structure that is formed on the non-actuating area (II and III). More specifically, the active electrodes 131, 133, 135, and 137 of the first unit layer corresponding to odd numbered unit layers extend to the non-actuating area (III) disposed on the right of the actuating area (I) in FIG. 3 and are in contact with the extension electrodes 141, 143, 145, and 147 of the first unit layers, and the extension electrodes 141, 143, 145, and 147 of the first unit layers are in contact with each other through a first common electrode 151. The active electrodes 132, 134, 136 and 138 of the second unit layer corresponding to even numbered unit layers extend to the non-actuating area (II) disposed on the left of the actuating area (I) in FIG. 3 and are in contact with the extension electrodes 142, 144, 146, and 148 of the second unit layers, and the extension electrodes 142, 144, 146, and 148 of the second unit layers are in contact with each other through a second common electrode 152.

As described above, the multi EAP actuator 100 has a pair of interconnection electrode structures. In a narrow sense, the interconnection electrode structure may refer to a conductive element including the extension electrodes 141 to 148 and the common electrodes 151 and 152. Alternatively, in a broad sense, the interconnection electrode structure may refer to surrounding elements forming the non-actuating areas (II and III) in addition to the conductive element. For example, the interconnection electrode structure may include the EPA layer, the polymer layer, the via hole, the etch stopping layer, etc. Hereinafter, the interconnection electrode structure will be described in a broad sense.

As shown the non-actuating areas (II and III) in FIG. 6, the interconnection electrode structure includes a plurality of non-active layers and the common electrodes 151 and 152 plus the etch stopping layers 161 and 162. The etch stopping layers 161 and 162 prevent a substrate S supporting the multilayered EAP actuator 100 from being etched. Each of the lower parts of the common electrodes 151 and 152 is partially in contact with a respective upper surface of the etch stopping layers 161 and 162. The description thereof will be made later.

In the non-actuating area (III), a plurality of non-active layers includes the EAP layers 111 to 118, the protecting layers 121 to 128 formed on the EAP layers 111 to 118, respectively, and the extension electrodes 141, 143, 145, and 147 formed on the protecting layers 121, 123, 125, and 127 of the first unit layers, respectively. The extension electrodes 141, 143, 145, and 147 are in contact with the active electrodes 131, 133, 135, and 137, respectively. Similarly, in the non-actuating area (II), a plurality of non-active layers includes the EAP layers 111 to 118, the protecting layers 121 to 128 formed on the EAP layers 111 to 118, respectively, and the extension electrodes 142, 144, 146 and 148 formed on the protecting layers 122, 124, 126, and 128 of the second unit layers, respectively. The extension electrodes 142, 144, 146, and 148 are in contact with the active electrodes 132, 134, 136, and 138, respectively. Hereinafter, the following description will be made in relation to the non-actuating area (III) but may be applied to the non-actuating area (II).

The extension electrodes 141 to 148 are formed of conductive material, and there are no particular restrictions on the material of the extension electrodes 141 to 148. The extension electrodes 141 to 148 may be formed of material that is less reactive to laser than a polymer. For example, the extension electrodes 141 to 148 may be formed of a material selected from the group consisting of gold (Au), copper (Cu), titanium (Ti), aluminum (Al), chromium (Cr), molybdenum (Mo), and iron (Fe), and alloys thereof. An alloy of Aluminum (Al) and Copper (Cu) or an alloy of Aluminum (Al) and Titanium (Ti) has a great reactivity to laser and is not suitable for the material of the extension electrodes 141 to 148. If the extension electrodes 141 to 148 are formed of metal, a via hole H1 having a diameter which increases in a stepwise manner is formed all the way through the stacked non-actuating layers using a one step laser process. The extension electrodes 141 to 148 may each have a thickness of, for example, 50 to 500 nm, greater than that of each of the active electrodes 131 to 138.

The via holes H1 and H2 are formed all the way through the non-actuating layers. The via holes H1 and H2 may have a diameter which increases toward the uppermost non-actuating layer in a stepwise manner. As a result, in the non-actuating area (III), the widths of the extension electrodes 141, 143, 145, and 147 that are formed on the protecting layers 121, 123, 125, and 127 decrease in an upward direction. In the non-actuating area (II), the widths of the extension electrodes 142, 144, 146, and 148 that are formed on the protecting layers 122, 124, 126, and 126 decrease in an upward direction. Such a structure of the via hole H1 and H2 allow some parts of individual upper surfaces of the extension electrodes 141, 143, 145, and 147 to be exposed. That is, some parts of the individual extension electrodes 141, 143, 145, and 147 are respectively covered by the EPA layers formed on the upper surfaces of the individual extension electrodes 141, 143, 145, and 147, respectively. However, remaining parts of the individual extension electrodes 141, 143, 145, and 147 are exposed through the via hole H1 and H2.

Figure 7:
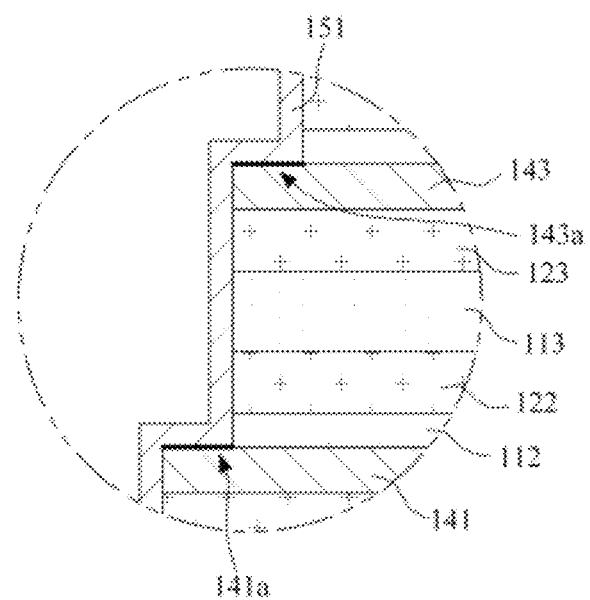
FIG. 7 is an enlarged view showing a portion corresponding to the dotted line of FIG. 6.

The via hole H1 is formed therein with the common electrode 151. (Similarly, the via hole H2 is formed therein with the common electrode 152.) The common electrode 151 may be provided in a uniform thickness to correspond to the profile of the via hole H1 or to have a thickness depending on position within the via hole H1. Alternatively, the common electrode 141 may completely fill in the via hole H1. In any of the above cases, the common electrode 141 has at least a step-shape profile. Such a common electrode 151 makes contact with the individual upper surfaces of the extension electrodes 141, 143, 145 and 147 such that the extension electrodes 141, 143, 145, and 147 are electrically connected to each other. Accordingly, the active electrodes 131, 133, 135, and 137 making contact with the extension electrodes 141, 143, 145, and 147, respectively, are electrically connected to each other FIG. 7 is an enlarged view showing a portion corresponding to the dotted line of FIG. 6. As shown in FIG. 7, a second non-actuating layer including the second EPA layer 112, the second protecting layer 122, the third EAP layer 113, the third protecting layer 123, and the third extension electrode 143 has a width smaller than that of a first non-actuating layer including the first EAP layer 111, the protecting layer 121, and the first extension electrode 141. Accordingly, the second non-actuating layer is not formed on a part 141*a* of the upper surface of the first extension electrode 141. Similarly, a third non-actuating layer is not formed on a part 143*a* of the upper surface of the third extension electrode 143.

As described above, according to the structure of the non-actuating layers in which parts 141*a* and 143*a* of the extension electrodes are exposed and the via hole H1 has a diameter which increases in a stepwise manner in the non-actuating layers, the common electrode 151 formed in the via hole H1 has a step-shape profile. As the common electrode 151 has a step-shape profile, upper surfaces and lateral sides of the common electrode 151 are in contact with the extension electrodes 131, 133, 135, and 137, thereby increasing the contact area. Accordingly, the interconnection electrode structure shown in FIG. 6 provides an improved electrical connectivity between the common electrode 151 and the extension electrodes 141, 143, 145, and 147, and therefore, the electrical connectivity between the extension electrodes 141, 143, 145, and 147 and the active electrodes 131, 133, 135, and 137 is also improved.

Figure 8:
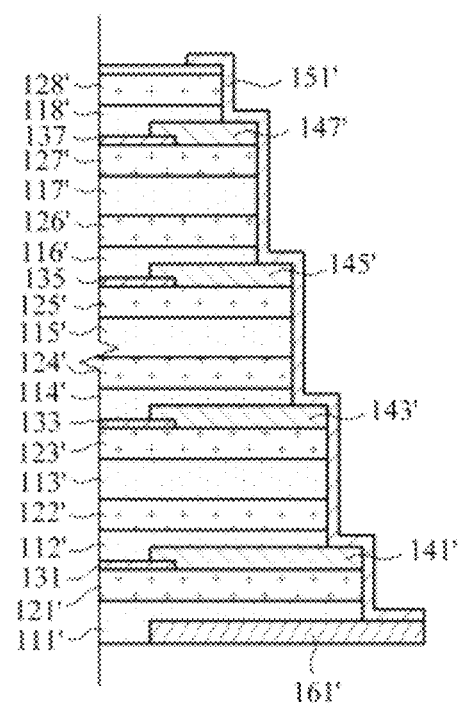
FIG. 8 is a view showing an example of an interconnection electrode.

FIG. 8 is a view showing an example of an interconnection electrode. As shown in FIG. 8, the interconnection electrode structure may further include an etch stopping layer 161' in addition to a plurality of non-actuating layers and a common electrode 151'. The non-actuating layers include EPA layers 111' to 118', protecting layers 121' to 128' formed on the EAP layers 111' to 118', respectively, and extension electrodes 141', 143', 145', and 147' that are formed on upper surfaces of the protecting layers 121', 123', 125', and 127' of the first unit layers, respectively. The extension electrodes 141', 143', 145', and 147' are connected to the active electrodes 121', 123', 125', and 127' of the first unit layer, respectively.

Different from the interconnection electrode structure shown in FIG. 6 that is formed therein with a via hole, the interconnection electrode structure shown in FIG. 8 includes the non-actuating layers are formed with one side having a step profile and as such have widths which decrease in a stepwise manner upwards. Accordingly, the widths of the EAP layers 111' to 118', the protecting layers 121' to 128, and the extension electrodes 141', 143', 145', and 147' formed on the protecting layers 121', 123', 125', and 127' of the first unit layer, respectively, decrease in an upward direction. Such a structure of the non-actuating layers allows some parts of individual upper surfaces of the extension electrodes 141', 143', 145', and 147' to be exposed. In addition, the exposed upper surfaces of the individual extension electrodes 141', 143', 145', and 147' make contact with the common electrode 151'. In this manner, the common electrode 151' connecting the stacked extension electrodes 141', 143' 145', and 147' to each other forms a step shape profile and thus improves the electrical connection of the common electrode 151' with respect to the extension electrodes 141', 143', 145', and 147'.

The multilayered EAP device described above is small and thin and also provides a large displacement, and thus can provide a wide range of applications. For example, the multilayered EAP actuator may be applied to a varifocal fluidic lens. The varifocal fluidic lens is a device allowing functions such as an Auto-Focus (AF) function, an Optical Image Stabilization (OIS) function and a varifocal function, etc., of a microsized Image Sensor Module (ISM) used in a high performance camera for a mobile device.

Figure 9A:
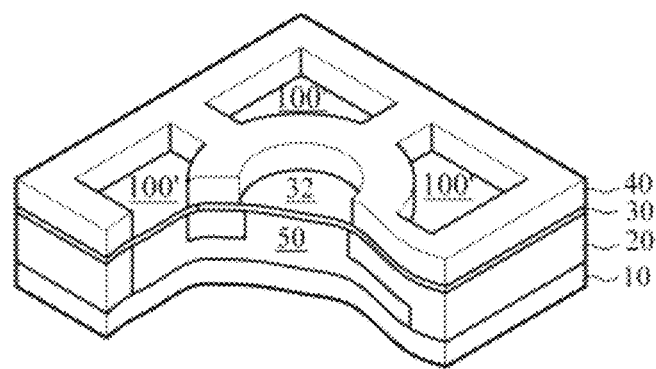
FIG. 9A is a partial cross sectional view showing a configuration of an example of a varifocal fluidic lens having the multilayered EAP actuator.
Figure 9B:
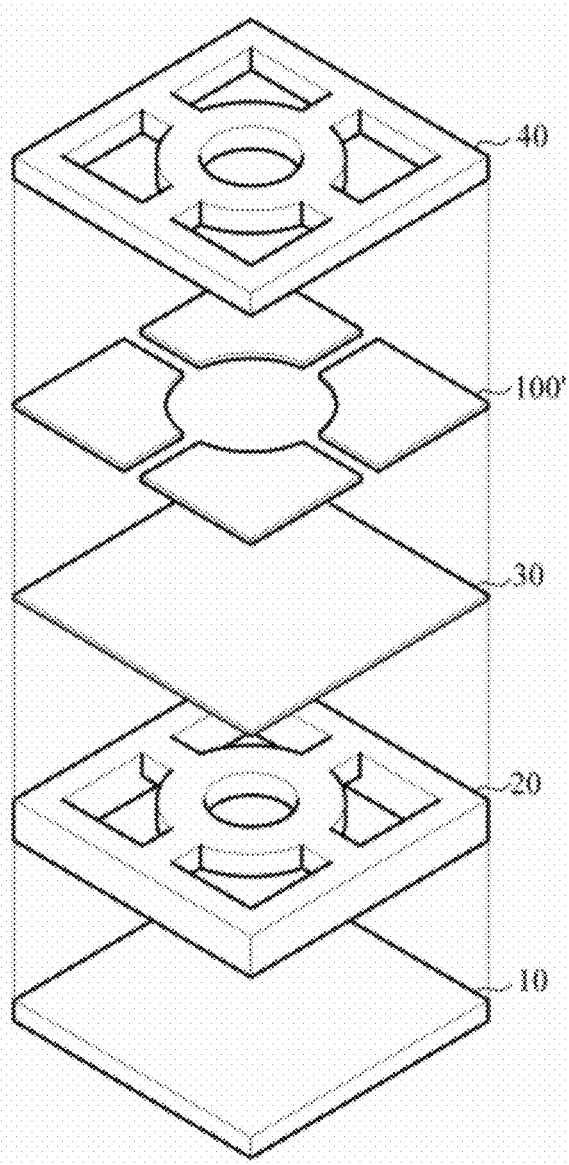
FIG. 9B is an exploded perspective view showing the varifocal fluidic lens of FIG. 9A.

FIG. 9A is a partial cross sectional view showing a configuration of an example of a varifocal fluidic lens having the multilayered EAP actuator. FIG. 9B is an exploded perspective view showing the varifocal fluidic lens of FIG. 9A. As shown in FIGS. 9A and 9B, the varifocal fluidic lens includes a substrate 10, a spacer frame 20, a membrane 30, a multilayered EAP actuator 100', and an actuator frame 40. The multilayered EAP actuator 100' is an example of the multilayered EAP actuator 100 shown in FIG. 1.

The substrate 10 is formed of a transparent material, for example, glass or transparent polymer. The spacer frame 20 is used to define an inner space of the varifocal fluidic lens, which may be filled with optical fluid and may be formed of a non transparent material such as silicon (Si). The inner space is divided into an upper portion and a lower portion. The upper portion is divided into a lens portion formed in the center of the inner space and a plurality of driving portions. The lower portion may be formed as one space such that optical fluid flows all the way through the inner space of the lower portion.

The membrane 30 covers at least the lens portion, serving as a lens surface. The membrane 30 may cover the driving portions or not. The lens portion is filled with optical fluid to serve as a lens allowing incident light to pass therethrough. The driving portions transmit a driving force capable of modifying a profile of a part (lens surface) of the membrane 30 covering the lens portion. Although the example of the varifocal fluidic lens includes four driving portions formed at respective outer sides of the lens portion, the driving portions may be provided in differing numbers and locations.

As depicted, the multilayered EAP actuator 100 is disposed on the membrane 30. Specifically, the actuating area of the multilayered EAP actuator 100 covers at least the driving portions. If a driving voltage is applied, the multilayered EAP actuator 100 produces a displacement downward and applies a predetermined pressure to the active electrodes (131 to 138 in FIG. 6). As a predetermined pressure is applied to the active electrodes from an upper side thereof, the optical fluid contained in the driving portions moves toward the lens portion. The optical fluid transferred from the driving portions increases the amount of optical fluid contained in the lens portion, and the lens portion bulges upwards.

The fixing frame 40 is disposed on the multilayered EAP actuator 100 to firmly fix the membrane 30 and/or the multilayered EAP actuator 100 to the spacer frame 20. The fixing frame 40 may have a planar shape exposing at least the lens portion and may expose the multilayered EAP actuator 100. The fixing frame 40 may be formed of silicon.

Hereinafter, a method of manufacturing the multilayered EAP device 100 of FIG. 6 on a substrate will be described with reference to FIGS. 10A to 10J. FIGS. 10A to 10J are cross sectional views showing a method of manufacturing the multilayered EAP device of FIG. 5. For the sake of convenience, the following description will be made in relation to a process of manufacturing one multilayered EAP device 100. However, the method may be applied when simultaneously forming a plurality of multilayered EAP devices in a matrix at a wafer level process. The method of manufacturing the multilayered EAP device 100 includes alternately staking two types of unit layers on a substrate (see FIGS. 2A and 2B) and forming an interconnection electrode structure in the non-actuating areas (II and III) of the stacked unit layers.

According to this example, the unit layer is formed in the order of the EAP layer, the protecting layer, and the electrode. However, the order of forming the protecting layer and the electrode may be exchanged (see FIG. 3B). Alternatively, the unit layer may be formed in the order of the EPA layer, the first protecting layer, the electrode, and the second protecting layer (see FIG. 3C), in which case, a process of forming the second protecting layer is added to the method of manufacturing the multilayered EAP device to be described below.

Figure 10A:
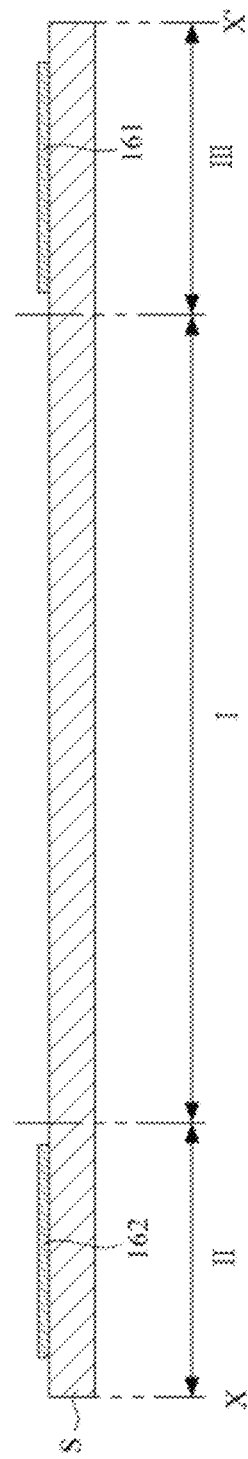

As shown in FIG. 10A, first, a substrate (S) is prepared. The substrate may include an actuator frame formed using silicon. A bottom surface of the substrate may have a trench having a size corresponding to the active area (I) such that a portion of the substrate (S) corresponding to the active area (I) is easily removed in a following process. Although not shown in drawings, an insulating layer, such as silicon oxide layer ($SiO_2$) may be further formed on the surface of the substrate (S).

Etch stopping layers 161 and 162 are formed on the substrate (S). The etch stopping layers 161 and 162 prevent the substrate (S) from being etched during a via hole forming process to be described later with reference to FIG. 10I. Accordingly, the etch stopping layers 161 and 162 are formed on a position determined as the non-actuating area (II and III). In the case where a laser beam is used for the via hole forming process, the etch stopping layers 161 and 162 may be formed of material having a high resistance to a laser beam.

Figure 10B:
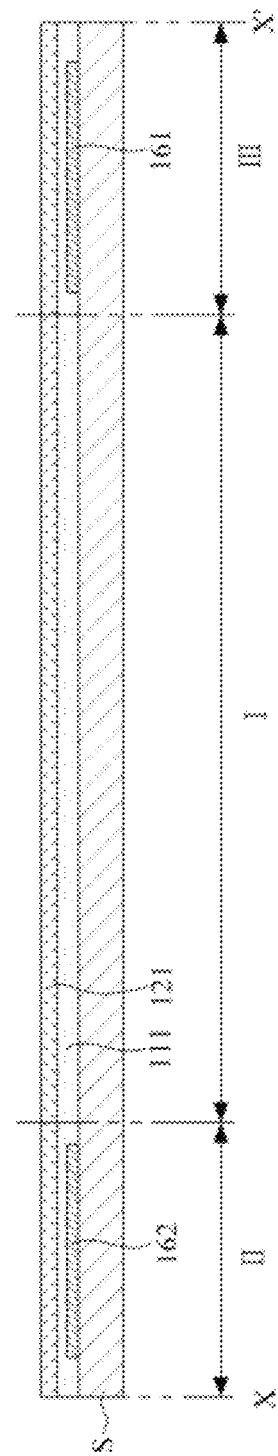

As shown in FIG. 10B, the first EAP layer 111 is formed on the substrate (S) on which the etch stopping layers 161 and 162 are formed. The first EAP layer 111 is formed through a solution casting. For example, the first EAP layer 111 may be formed using a P(VDF-TrFE-CFE) polymer. In this case, the P(VDF-TrFE-CFE) polymer is dissolved in a solvent such as methyl isobutyl ketone (MIBK) or methyl butyl ketone (MBK) to obtain an EAP solution. The EAP solution is applied to the substrate and then spread in a desired shape, for example, a film shape. The EAP solution may be shaped through spin coating. A solvent is removed from the applied solution, by use of its volatile characteristic, thereby forming the first EAP layer 111. The first EPA layer 111 may completely cover the etch stopping layers 161 and 162 or may partially expose the etch stopping layers 161 and 162. The first EAP layer 111 may be provided in a thickness of about 1 μm or less.

The first protecting layer 121 is formed on the first EPA layer 111. A method of manufacturing the first protecting layer 121 is not limited. For example, the first protecting layer 121 may be formed through spin coating. If the first EAP layer 111 is formed using a solution including a MIBK or MBK solvent dissolving a P(VDF-TrFE-CFE) polymer, the first protecting layer 121 may be formed using a solution including a predetermined polymer resoluble in water or alcohol through spin coating. For example, the polymer used to form the protecting layer 121 may be a polymer including at least one selected from the group consisting of polyvinylphenol (PVP), polymethylmethacrylate (PMMA), polyvinylalcohol (PVA), polydimethylsiloxane (PDMS), poly(4-vinylpyridine)(P4VP) and polyacrylic Acid(PAA), and combinations thereof.

Figure 10C:
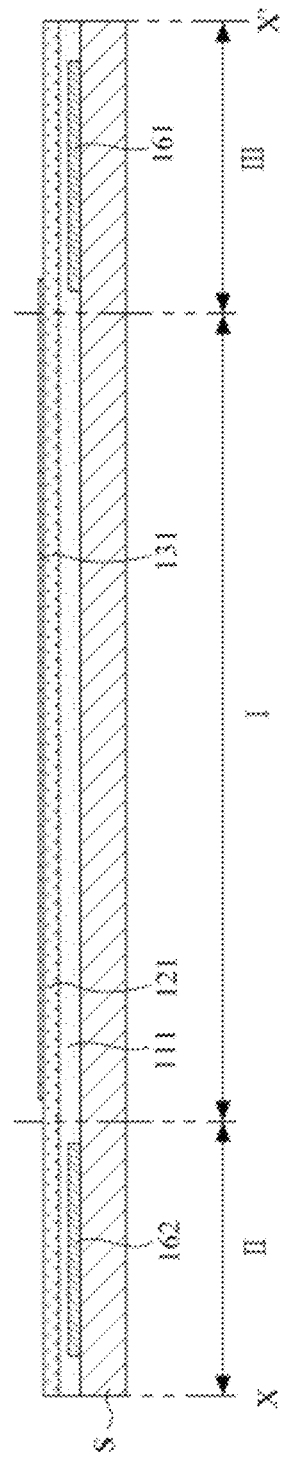

As shown in FIG. 10C, the first active electrode 131 is formed on the first protecting layer 121. The first active electrode 131 may cover the actuating area (I) and extends to the non-actuating area (III). The first active electrode 131 may be formed of conductive polymer or metal material including at least one selected from the group consisting of gold (Au), copper (Cu), silver (Ag), aluminum (Al), nickel (Ni), chrome (Cr), iron (Fe), and combinations thereof. When the first active electrode 131 is formed using a metal material, the metal material may be deposited through a general deposition scheme, such as sputtering and physical vapor deposition (PVD).

Figure 10D:
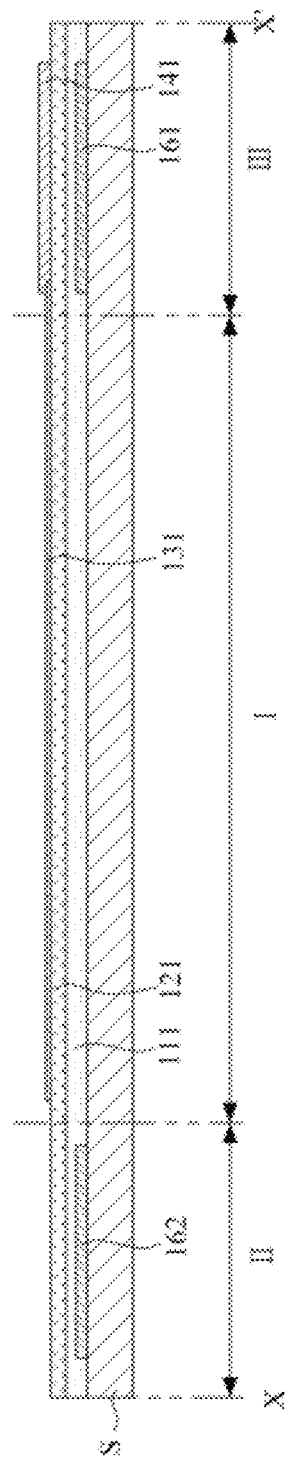

As shown in FIG. 10D, the first extension electrode 141 is formed on the non-actuating area (III). The first extension electrode 141 is formed on the first protecting layer 121 and has a portion making contact with the first active electrode 131, in particular, making contact with a portion of the first active electrode 141 extending to the non-actuating area (III). The first extending electrode 141 may be formed of material having a low electrical resistance and having a lower reactivity to a laser beam than the polymer. For example, the first extension electrode 141 may be formed of metal selected from the group consisting of gold (Au), copper (Cu), titanium (Ti), chromium (Cr), molybdenum (Mo), and aluminum (Al), and may be provided in a thickness of about 50 to 5000 nm. The first extension electrode 141 may be formed using the same method as that of the first active electrode 131.

Figure 10E:
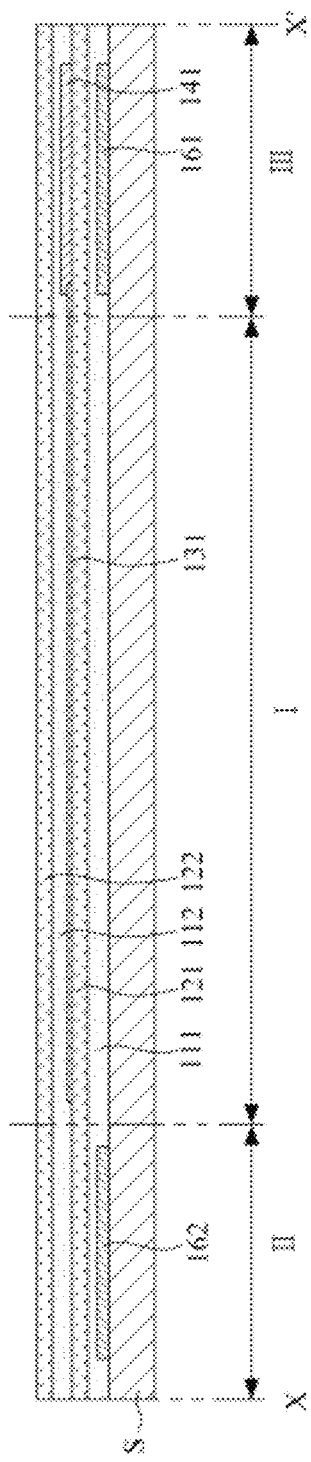

As shown in FIG. 10E, the second EAP layer 112 is formed on the first protecting layer 121 on which the first active electrode 131 and the first extension electrode 141 are formed. The second EAP layer 112 may be formed through the same method as that of the first EAP layer, and has the same thickness and material as those of the first EAP layer. That is, the second EAP layer 112 may be formed through solution casting. In this case, the first protecting layer 121 prevents a solvent from the second EAP layer 112 from penetrating into the first active electrode 131 and the first extension electrode 141. Thereafter, the second protecting layer 122 is formed on the second EAP layer 112 through the same manufacturing method as that of the first protecting layer 121, and has the same thickness and material as the first protecting layer 121.

Figure 10F:
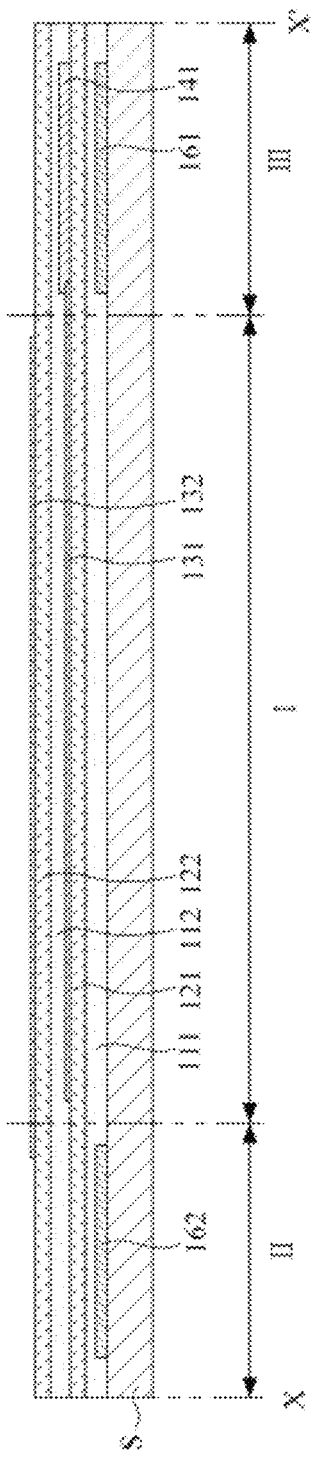
Figure 10G:
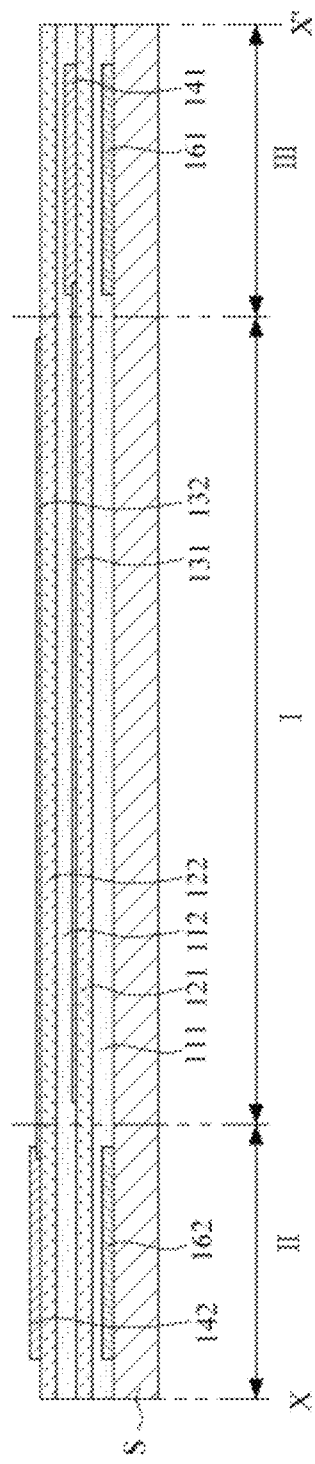

As shown in FIG. 10F, the second active electrode 132 is formed on the second protecting layer 122. The second active electrode 132 covers the actuating area (I) and extends to the non-actuating area (II). Since the manufacturing method, the thickness and the material of the second active electrode 132 are identical to those of the first active electrode 131, a detailed description thereof will be omitted. As shown in FIG. 10G, the second extension electrode 142 is formed on the non-actuating area (II). The second extension electrode 142 is formed on the second protecting layer 122 and has a portion making contact with the second active electrode 132, in particular, making contact with a portion of the second active electrode 132 extending to the non-actuating area (II). Since the manufacturing method, the thickness, and the material of the second extension electrode 142 are identical to those of the first extension electrode 141, a detailed description thereof will be omitted.

Figure 10H:
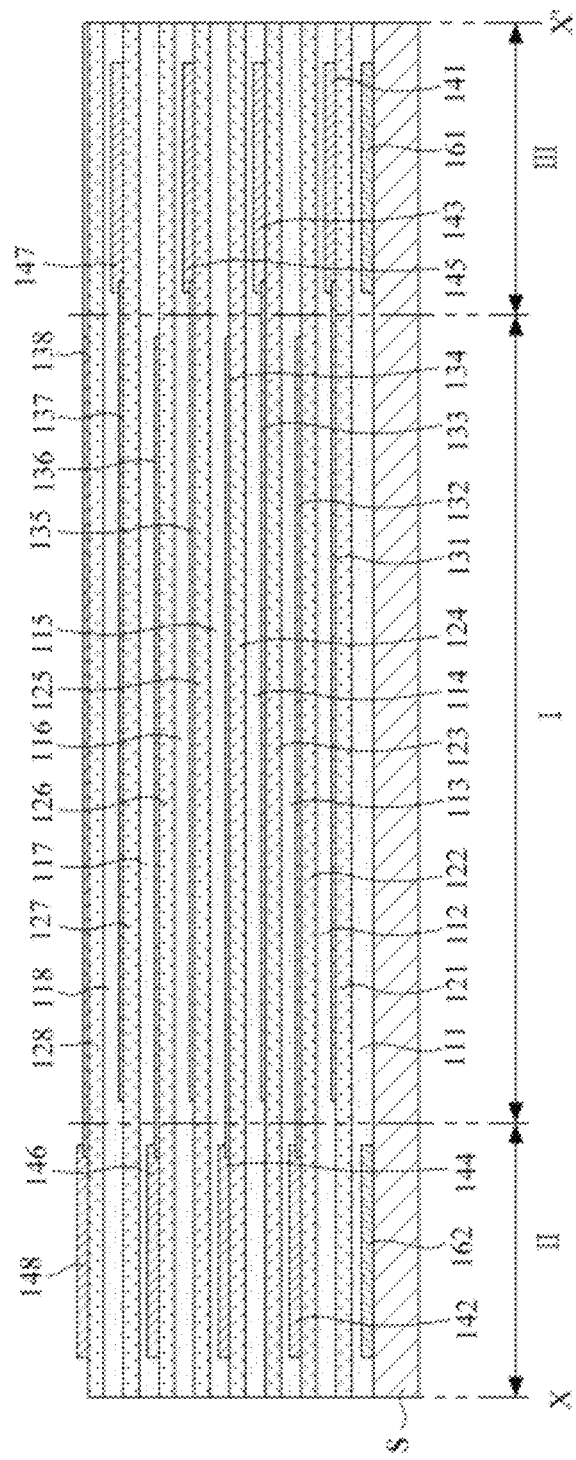

As shown in FIGS. 10B to 10G, a sequence including the forming of the EAP layer, the protecting layer, the active electrode, and the extension electrode is repeated a predetermined number of times, for example, 4 times, thereby forming a stacked structure shown in FIG. 10H.

As shown in FIG. 10I, the non-actuating areas (II and III) of the stacked structure, in particular, the extension electrodes 141 to 148, the protecting layers 121 to 128, and the EAP layer 111 to 118 corresponding to the middle portion of the extension electrodes 141 to 148 of the non-actuating area (II and III), are etched, thereby forming via holes H1 and H2. The via holes H1 and H2 are provided in a step shapes having diameters which increase upwards such that some parts of the individual upper surfaces of the extension electrodes 141 to 148 are exposed. In order to form a step shape according to another example, the extension electrodes 141 to 148, the protecting layers 121 to 128, and the EAP layers 111 to 118 corresponding to outer edges of the extension electrodes 141 to 148 may be etched.

A metal material forming the extension electrodes 141 to 148 and a polymer material forming the protecting layers 121 to 128 and the EPA layers 111 to 118 exhibit differences in physical properties, for example, in modulus of elasticity and thermal expansion coefficient. If the EAP layers 111 to 118, the protecting layers 121 to 128, and the extension electrodes 141 and 148 are physically cut to form a via hole in the non-actuating area (II and III) of the stacked structure shown in FIG. 10H, the cut portion of the polymer layers 111 to 118 and 121 to 128 expands and covers the cut portions of the extension electrodes 141 to 148. This is due to heat generated during the cutting process or inherent physical properties of the polymer. If the cut portion of the extension electrodes 141 to 148 is not exposed, the stacked extension electrodes 141 to 148 are not easily connected to each other. In addition, conventional etching technologies such as dry etching or wet etching may damage the polymer layers 111 to 118 and 121 to 128 and may also cause delamination, and thus it is difficult to apply such conventional etching technology in forming a via hole In order to form the via holes H1 and H2 having diameters which increase upwards, the polymer layers 111 to 118 and 121 to 128 and the extension electrodes 141 to 148 are etched using a laser that reacts strongly with polymers but less strongly with the metal forming the extension electrodes 141 and 148. The laser may be a carbon dioxide ($CO_2$) laser or a green laser. There are no particular restrictions on the laser used for the etching In particular, it is assumed that a laser such as a carbon dioxide laser having a predetermined energy is incident onto the left side non-actuating area (III) of the stacked structure. The laser removes a great amount of an eighth EAP layer 118 and eighth protecting layer 128, which are formed of polymer having a great reactivity with respect to laser, and this process is performed with a small amount of energy consumption. After that, the laser beam passing through the eighth EAP layer 118 and the eighth protecting layer 128 reaches a seventh extension electrode 147. However, the seventh extension electrode 147 is formed of metal material having a low reactivity to the laser, so a relatively large amount of energy of laser is required to etch the seventh extension electrode 147. As a result, the removed portion of the seventh extension electrode 147 is smaller than that of the eighth EAP layer 118 and the eight protecting layer 128 during a laser etching, that is, when viewed in FIG. 6, the width of the removed portion of the seventh extension electrode 137 is narrower than that of the eighth EAP layer 118 and the eighth protecting layer 128. In this manner, a reduced amount of laser passes through the seventh extension electrode 147 downward. However, when a sixth EAP layer, a seventh EAP layer, and protecting layers 116, 117, 126, and 127 are etched, additional energy is not consumed and the width of the removed portion of the sixth and seventh EAP layers and the protecting layers 116, 117, 126, and 127 is almost the same as that of the eighth extension electrode 148.

As described above, a great amount of energy is consumed to etch the extension electrodes 141, 143, 145, and 147 using laser, so the power of energy of the laser is reduced in a downward direction in a stepwise manner or discontinuous manner. As a result, as shown in FIG. 6, the via holes H1 and H2 having a step shape profile are formed in the non-actuating areas (II and III) of the stacked structure, and parts of the extension electrodes 141 to 148 are exposed through the via holes H1 and H2

Figure 10J:
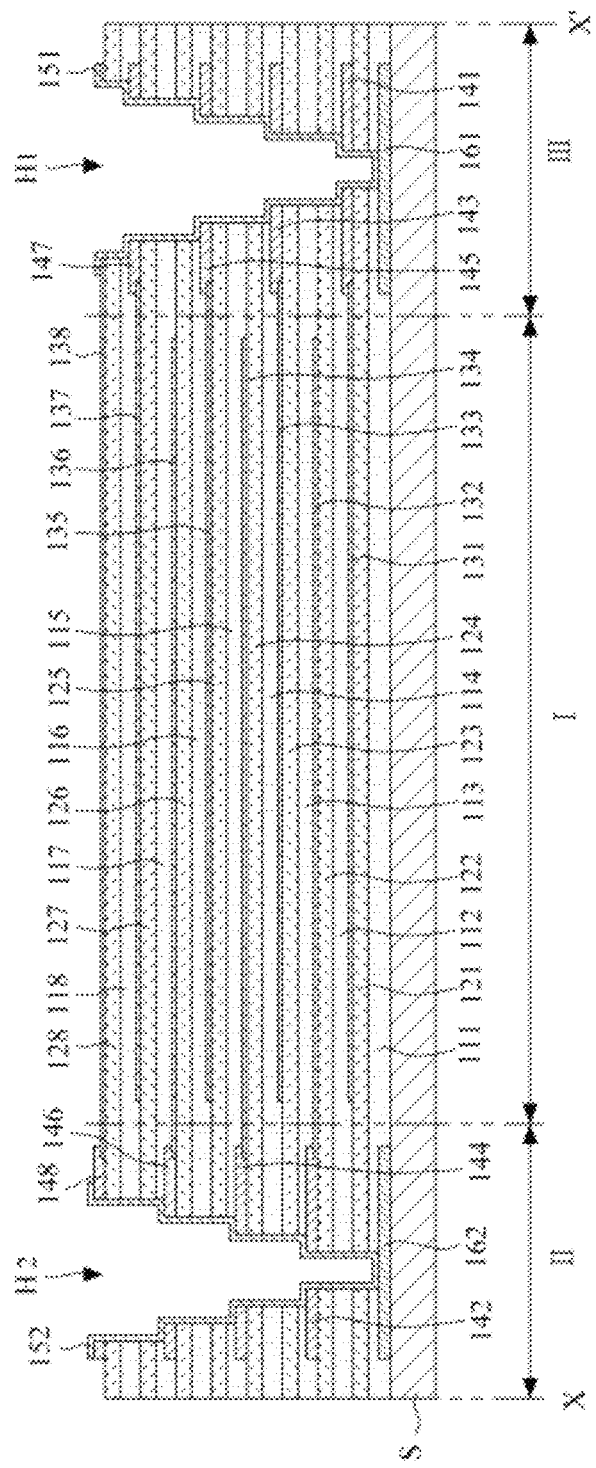

As shown in FIG. 10J, the common electrodes 151 and 152 are formed in the via holes H1 and H2 of the non-actuating area (II and III). The common electrodes 151 and 152 are formed of conductive material such as metal and there are no restrictions on the method of forming the common electrodes 151 and 152. The common electrodes 151 and 152 may be formed to correspond to the profile of the via holes H1 and H2 in a predetermined thickness, for example, 1000 nm or above. Alternatively, the common electrodes 151 and 152 may be formed in a great thickness to entirely fill the via holes H1 and H2. Such common electrodes 151 and 152 have a step shape profile which makes contact with the exposed upper surfaces of the extension electrodes 141 to 148.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other exemplary embodiments are within the scope of the following claims.

What is claimed is:

1. A multilayered electroactive polymer (EAP) device comprising a plurality of unit layers that are stacked on top of each other, in which each of the plurality of unit layers comprises:
   an EAP layer formed of an electro-active polymer (EAP);
   a protective layer configured to prevent a material from penetrating into the EAP layer, the protective layer being formed on the EAP layer to cover an entire upper surface of the EAP layer; and
   an active electrode.

2. The multilayered EAP device of claim 1, wherein the protective layer is formed directly on the EAP layer.

3. The multilayered EAP device of claim 1, wherein the active electrode is formed directly on one portion of the EAP layer and the protective layer is formed directly on the active electrode and a portion of the EAP layer on which the active electrode is not formed.

4. The multilayered EAP device of claim 1, wherein the protective layer comprises a first protective layer and a second protective layer, and the active electrode is disposed between the first protective layer and the second protective layer.

5. The multilayered EAP device of claim 1, wherein the protective layer is formed of a polymer which is not resoluble to a first solvent to which the EAP is resoluble.

6. The multilayered EAP device of claim 5, wherein the polymer of the protective layer is further resoluble to a second solvent to which the EAP is not resoluble.

7. The multilayered EAP device of claim 5, wherein the EAP layer is formed of polyvinylidene fluoride, polyvinylidene fluoride-trifluoroethylene polyvinylidene fluoride-trifluoroethylene-chlorofluoroethylene, or polyvinylidene fluoride-trifluoroethylene-chlorotrifluoroethylene,
   and the protective layer includes at least one selected from the group consisting of polyvinylphenol, polymethylmethacrylate, polyvinylalcohol, polydimethylsiloxane, poly(4-vinylpyridine) and polyacrylic acid, and combinations thereof.

8. The multilayered EAP device of claim 1, wherein the active electrode is formed of a metal material or a conductive material, the metal material or the conductive material having a thickness of about 100 nm or less.

9. The multilayered EAP device of claim 8, wherein the metal material includes at least one selected from the group consisting of gold (Au), copper (Cu), silver (Ag), aluminum (Al), nickel (Ni), chrome (Cr), iron (Fe) and combinations thereof.

10. The multilayered EAP device of claim 8, wherein the conductive polymer includes at least one selected from the group consisting of polyaniline, polypyrrole, PEDOT[poly(3,4-ethylenedioxythiophene)]:PSS[poly(4-styrenesulfonic acid)], and combinations thereof.

11. The multilayered EAP device of claim 1, wherein the EAP includes a silicone based dielectric elastomer or a polyurethane based dielectric elastomer.

12. The multilayered EAP device of claim 1, wherein the each of the plurality of unit layers further comprises an extension electrode that is electrically connected to the active electrode, wherein extension electrodes of two adjacent unit layers among the unit layers stacked on a top of each other are disposed opposite to each other with respect to the active electrodes.

13. The multilayered EAP device of claim 12, further comprising a common electrode that electrically connects a lateral surface to a top surface of each of the extension electrodes.

14. The multilayered EAP device of claim 13, further comprising an etch stopping layer which makes contact with one surface of the common electrode; and
    a via hole comprising a width which increases in an upward direction,
    wherein the common electrode is disposed in the via hole.

15. The multilayered EAP device of claim 13, further comprising a plurality of non-active layers that are formed with one side having a step profile; and
    an etch stopping layer which is in contact with one surface of the common electrode, wherein the common electrode is formed on the one side of the non-active layers.

16. A multilayered electroactive polymer (EAP) device comprising:
    a plurality of pairs of unit layers that are stacked on top of each other and is divided into an actuating area and a first non-actuating area and a second non-actuating area that are adjacent to two sides of the actuating area,
    wherein each of the pairs of unit layers comprises a first unit layer and a second unit layer, wherein the first unit layer comprises:
    a first EAP layer formed of an EAP;
    a first protective layer configured to prevent a material from penetrating into the first EAP layer, the first protective layer being formed on the first EAP layer so as to cover an entire upper surface of the first EAP layer; and
    a first active electrode which extends from the actuating area to the first non-actuating area, wherein the second unit layer comprises:
    a second EAP layer formed of the EAP, the second EAP layer being disposed directly on the first unit layer;
    a second protective layer configured to prevent a material from penetrating into the second EAP layer, the second protective layer being formed on the second EAP layer so as to cover an entire upper surface of the second EAP layer; and
    a second active electrode which extends from the actuating area to the second non-actuating area.

17. The multilayered EAP device of claim 16, wherein the first protective layer is formed directly on the first EAP layer and the second protective layer is formed directly on the second EAP layer.

18. The multilayered EAP device of claim 16, wherein the first active electrode is formed directly on one portion of the first EAP layer and the first protective layer is formed directly on the first active electrode and a portion of the first EAP layer on which the first electrode is not formed, and wherein the second active electrode is formed directly on one portion of the second EAP layer and the second protective layer is formed directly on the second active electrode and a portion of the second EAP layer on which the second electrode is not formed.

19. The multilayered EAP device of claim 16, wherein the first protective layer is of a plurality of first protective layers and the second protective layer is of a plurality of second protective layers and each of the first active electrode and the second active electrode is formed between the first protective layer and the second protective layer.

20. The multilayered EAP device of claim 16, wherein the first protective layer and the second protective layer are formed of a polymer which is not resoluble to a first solvent, to which the EAP is resoluble, and is resoluble to a second solvent to which the EAP is not resoluble.

21. The multilayered EAP device of claim 16, wherein each of the pairs of unit layers further comprises:
a first extension electrode which is formed on the first non-actuating area and is electrically connected to the first active electrode; and
a second extension electrode which is formed on the second non-actuating area and is electrically connected to the second active electrode,
wherein the multilayered electroactive polymer device further comprises:
a first common electrode which electrically connects the first extension electrodes, which are stacked on top of each other in the first non-actuating area, to each other; and
a second common electrode which electrically connects the second extension electrodes, which are stacked on top of each other in the second non-actuating area, to each other.

22. The multilayered EAP device of claim 21, wherein a first via hole, which has a width which increases stepwise in an upward direction, is formed in the first non-actuating area of the plurality of pairs of unit layers to expose parts of upper surfaces of the first extension electrodes,
a second via hole, which has a width which increases stepwise in the upward direction, is formed in the second non-actuating area of the plurality of pairs of unit layers to expose parts of upper surfaces of the second extension electrodes, and
the first common electrode is formed in the first via hole and the second common electrode is formed in the second via hole.

23. The multilayered EAP device of claim 21, wherein the plurality of pairs of unit layers in the first non-actuating area are formed with one side having one step profile which exposes the parts of the upper surfaces of the first extension electrodes,
the plurality of pairs of unit layers in the second non-actuating area are formed with one side having another step profile which exposes the parts of the upper surfaces of the second extension electrodes, and
the first common electrode is formed on the one side of the plurality of pairs of unit layers in the first non-actuating area and the second common electrode is formed on the one side of the plurality of pairs of unit layers in the second non-actuating area.

24. A multilayered electroactive polymer (EAP) device comprising a plurality of unit layers that are stacked on top of each other, in which each of the plurality of unit layers comprises:
an EAP layer formed of an electro-active polymer selected from the group consisting of P(VDF-TrFE-CFE)(poly(vinylidene fluoride-trifluoroethylene-chlorofluoroethylene) and P(VDF-TrFE-CTFE) (poly(vinylidene fluoride-frifluoroethylene-chlorotrifluoroethylene);
a protective layer configured to prevent a material from penetrating into the EAP layer, selected from the group consisting of polyvinylphenol and polyacrylic acid; and
an active electrode.

25. A multilayered electroactive polymer (EAP) device comprising:
a plurality of pairs of unit layers that are stacked on top of each other and is divided into an actuating area and a first non-actuating area and a second non-actuating area that are adjacent to two sides of the actuating area,
wherein each of the pairs of unit layers comprises:
a first EAP layer formed of an EAP;
a first protective layer configured to prevent a material from penetrating into the first EAP layer;
a first active electrode which extends from the actuating area to the first non-actuating area;
a second EAP layer formed of the EAP, the second layer being disposed on the first EAP layer;
a second protective layer configured to prevent a material from penetrating into the second EAP layer; and
a second active electrode which extends from the actuating area to the second non-actuating area;
wherein each of the EAP layers independently comprises an EAP selected from the group consisting of P(VDF-TrFE-CFE)(poly(vinylidene fluoride-trifluoroethylene-chlorofluoroethylene) and P(VDF-TrFE-CTFE) (poly(vinylidene fluoride-frifluoroethylene-chlorotrifluoroethylene); and
wherein each of the protective layers independently comprises a polymer selected from the group consisting of polyacrylic acid and polyvinylphenol.

* * * * *